(12) United States Patent
Shin et al.

(10) Patent No.: US 11,653,531 B2
(45) Date of Patent: May 16, 2023

(54) TRANSPARENT DISPLAY DEVICE HAVING DISPLAY AREA INCLUDING TRANSMISSIVE AREA AND NON-TRANSMISSIVE AREA

(71) Applicant: LG Display Co., Ltd., Seoul (KR)

(72) Inventors: KiSeob Shin, Paju-si (KR); ChangSoo Kim, Paju-si (KR); EuiTae Kim, Paju-si (KR); Soyi Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 175 days.

(21) Appl. No.: 17/132,701

(22) Filed: Dec. 23, 2020

(65) Prior Publication Data

US 2021/0202641 A1 Jul. 1, 2021

(30) Foreign Application Priority Data

Dec. 30, 2019 (KR) .......................... 10-2019-0177848

(51) Int. Cl.
| | | |
|---|---|---|
| *H01L 29/12* | (2006.01) | |
| *H01L 27/32* | (2006.01) | |
| *H01L 51/52* | (2006.01) | |
| *H01L 27/12* | (2006.01) | |

(52) U.S. Cl.
CPC ...... *H01L 27/3265* (2013.01); *H01L 27/3262* (2013.01); *H01L 27/3276* (2013.01); *H01L 51/5212* (2013.01); *H01L 27/1255* (2013.01); *H01L 27/322* (2013.01); *H01L 27/3211* (2013.01); *H01L 27/3246* (2013.01); *H01L 27/3258* (2013.01)

(58) Field of Classification Search
CPC ............. H01L 27/3246; H01L 27/3265; H01L 27/3262; H01L 27/3276; H01L 27/3258; H01L 51/5212; H01L 51/1255
USPC .......................................................... 257/71
See application file for complete search history.

(56) References Cited

U.S. PATENT DOCUMENTS

| | | | |
|---|---|---|---|
| 9,620,613 B2 | 4/2017 | Park et al. | |
| 10,199,446 B2 | 2/2019 | Kim et al. | |
| 10,466,560 B2 | 11/2019 | Yamazaki et al. | |
| 2011/0122330 A1* | 5/2011 | Tae ..................... | H01L 27/1288 445/24 |

(Continued)

FOREIGN PATENT DOCUMENTS

| | | |
|---|---|---|
| KR | 10-2016-0010760 A | 1/2016 |
| KR | 10-2018-0120342 A | 11/2018 |

(Continued)

*Primary Examiner* — Phuc T Dang
(74) *Attorney, Agent, or Firm* — Seed IP Law Group LLP

(57) ABSTRACT

A transparent display device is disclosed, which may prevent a short circuit from occurring between first and second capacitor electrodes of a capacitor. The transparent display device includes a substrate provided with a display area including a transmissive area and a non-transmissive area, in which a plurality of subpixels are disposed, and a non-display area adjacent to the display area, a driving transistor provided in the non-transmissive area over the substrate, including an active layer, a gate electrode, a source electrode and a drain electrode, and a capacitor provided in the non-transmissive area over the substrate, including a first capacitor electrode and a second capacitor electrode. The second capacitor electrode is not overlapped with the active layer of the driving transistor.

17 Claims, 14 Drawing Sheets

(56) References Cited

U.S. PATENT DOCUMENTS

| | | |
|---|---|---|
| 2011/0156995 A1 | 6/2011 | Choi et al. |
| 2015/0137101 A1* | 5/2015 | Choi .................. H01L 51/5271 257/40 |
| 2016/0352989 A1* | 12/2016 | Toya .................. G06V 40/1318 |
| 2017/0162636 A1 | 6/2017 | Park et al. |
| 2017/0193876 A1 | 7/2017 | Choi et al. |
| 2018/0033847 A1 | 2/2018 | Kim et al. |
| 2019/0243200 A1* | 8/2019 | Park .................. G02F 1/134309 |

FOREIGN PATENT DOCUMENTS

| | | |
|---|---|---|
| TW | 201704779 A | 2/2017 |
| TW | 201826521 A | 7/2018 |

* cited by examiner

TRANSPARENT DISPLAY DEVICE HAVING DISPLAY AREA INCLUDING TRANSMISSIVE AREA AND NON-TRANSMISSIVE AREA

CROSS REFERENCE TO RELATED APPLICATION

This application claims priority from Korean Patent Application No. 10-2019-0177848, filed on Dec. 30, 2019, which is hereby incorporated by reference for all purposes as if fully set forth herein.

BACKGROUND

Technical Field

The present disclosure relates to a transparent display device.

Description of the Related Art

With advancement in information-oriented societies, demands for display devices that display an image have increased in various forms. Recently, various types of display devices such as a liquid crystal display (LCD) device, a plasma display panel (PDP) device, and an organic light emitting display (OLED) device, a quantum dot light emitting display (QLED) device have been widely utilized.

Recent, studies for transparent display devices for allowing a user to look at objects or image arranged on an opposite side of a display device after transmitting the display device are actively ongoing.

A transparent display device includes a display area on which an image is displayed, and a non-display area, wherein the display area may include a transmissive area that may transmit external light, and a non-transmissive area.

BRIEF SUMMARY

The inventors of the present disclosure have recognized one or more problems in the related art. Namely, since the transmissive area is provided in the display area of the transparent display device, an area of the non-transmissive area that includes a light emission area is reduced. Further, since a plurality of circuit elements may be provided in a narrow non-transmissive area of the transparent display device, the circuit elements may have to be formed by being overlapped with each other. However, such approach may cause a short circuit between the circuit elements in the overlapped area. The inventors have provided one or more embodiments of the present disclosure that addresses one or more problems of the related art including those identified by the inventors above. For example, of the embodiments of the present disclosure provides a transparent display device that may prevent a short circuit from occurring between a driving transistor and a capacitor.

One or more embodiments of the present disclosure provides a transparent display device in which an anode electrode may stably be in contact with a driving transistor.

Further embodiments of the present disclosure provides a transparent display device that may increase or maximize a light emission area in a non-transmissive area.

In addition to the technical benefits of the present disclosure as mentioned above, additional benefits and features of the present disclosure will be clearly understood by those skilled in the art from the following description of the present disclosure.

In accordance with an aspect of the present disclosure, the above and other benefits can be accomplished by the provision of a transparent display device comprising a substrate provided with a display area including a transmissive area and a non-transmissive area, in which a plurality of subpixels are disposed, and a non-display area adjacent to the display area, a driving transistor provided in the non-transmissive area over the substrate, including an active layer, a gate electrode, a source electrode and a drain electrode, and a capacitor provided in the non-transmissive area over the substrate, including a first capacitor electrode and a second capacitor electrode. The second capacitor electrode is not overlapped with the active layer of the driving transistor. In one embodiment, the non-display area is positioned surrounding the display area, but this is not required.

In accordance with another aspect of the present disclosure, the above and other benefits can be accomplished by the provision of a transparent display device comprising a substrate provided with a display area including a transmissive area and a non-transmissive area, a light emitting diode provided in the non-transmissive area over the substrate, including an anode electrode, a light emitting layer and a cathode electrode, a driving transistor provided between the light emitting diode and the substrate and disposed in a first area of the non-transmissive area, and a capacitor provided between the light emitting diode and the substrate and disposed in a second area of the non-transmissive area. The second area where the capacitor is disposed is not overlapped with the first area where the driving transistor is provided.

According to the present disclosure, the driving transistor and the capacitor are disposed so as not to be overlapped with each other, whereby a short circuit may be prevented from occurring between the first and second capacitor electrodes of the capacitor.

Also, according to the present disclosure, an anode auxiliary electrode and a second planarization film may additionally be formed over the driving transistor and the capacitor, whereby a degree of freedom in a circuit design may be increased.

Also, according to the present disclosure, as a contact hole through which the anode electrode and the anode auxiliary electrode are in contact with each other is formed over the second capacitor electrode of the capacitor, flatness of the contact hole may be obtained and the contact hole may accurately be formed without damage of the anode auxiliary electrode. Therefore, the anode electrode and the anode auxiliary electrode may be stably in contact with each other.

In addition to the effects of the present disclosure as mentioned above, additional advantages and features of the present disclosure will be clearly understood by those skilled in the art from the above description of the present disclosure.

BRIEF DESCRIPTION OF THE SEVERAL VIEWS OF THE DRAWINGS

The above and other features and other advantages of the present disclosure will be more clearly understood from the following detailed description taken in conjunction with the accompanying drawings, in which.

DETAILED DESCRIPTION

Figure 1:
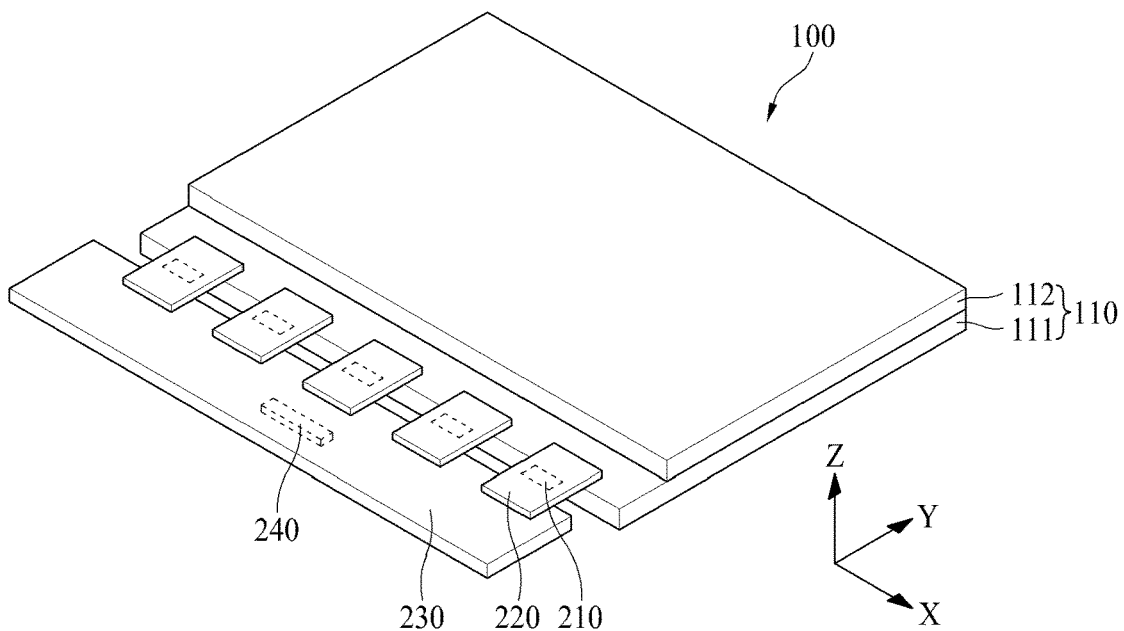
FIG. 1 is a perspective view illustrating a transparent display device according to one embodiment of the present disclosure.

Advantages and features of the present disclosure, and implementation methods thereof will be clarified through following embodiments described with reference to the accompanying drawings. The present disclosure may, however, be embodied in different forms and should not be construed as limited to the embodiments set forth herein. Rather, these embodiments are provided so that this disclosure will be thorough and complete, and will fully convey the scope of the present disclosure to those skilled in the art.

A shape, a size, a ratio, an angle, and a number disclosed in the drawings for describing embodiments of the present disclosure are merely an example, and thus, the present disclosure is not limited to the illustrated details. Like reference numerals refer to like elements throughout the specification. In the following description, when the detailed description of the relevant known function or configuration is determined to unnecessarily obscure the important point of the present disclosure, the detailed description will be omitted. In a case where 'comprise,' 'have,' and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when the position relationship is described as 'upon~,' 'above~,' 'below~,' and 'next to~,' one or more portions may be arranged between two other portions unless 'just' or 'direct' is used.

It will be understood that, although the terms "first," "second," etc., may be used herein to describe various elements, these elements should not be limited by these terms. These terms are only used to distinguish one element from another. For example, a first element could be termed a second element, and, similarly, a second element could be termed a first element, without departing from the scope of the present disclosure.

In describing elements of the present disclosure, the terms "first," "second," etc., may be used. These terms are intended to identify the corresponding elements from the other elements, and basis, order, or number of the corresponding elements are not limited by these terms. The expression that an element is "connected" or "coupled" to another element should be understood that the element may directly be connected or coupled to another element but may directly be connected or coupled to another element unless specially mentioned, or a third element may be interposed between the corresponding elements. In some embodiments, the phrase "made of" may be interpreted as "include" or "including."

Features of various embodiments of the present disclosure may be partially or overall coupled to or combined with each other, and may be variously inter-operated with each other and driven technically as those skilled in the art can sufficiently understand. The embodiments of the present disclosure may be carried out independently from each other, or may be carried out together in co-dependent relationship.

Hereinafter, an example of a transparent display device according to the present disclosure will be described in detail with reference to the accompanying drawings. Wherever possible, the same reference numbers will be used throughout the drawings to refer to the same or like parts.

FIG. 1 is a perspective view illustrating a transparent display device according to one embodiment of the present disclosure.

Hereinafter, X axis indicates a line parallel with a gate line, Y axis indicates a line parallel with a data line, and Z axis indicates a height direction of a transparent display device 100.

Although a description has been described based on that the transparent display device 100 according to one embodiment of the present disclosure is embodied as an organic light emitting display device, the transparent display device 100 may be embodied as a liquid crystal display device (LCD), a plasma display panel (PDP), a Quantum dot Light Emitting Display (QLED) or an Electrophoresis display device.

Referring to FIG. 1, the transparent display device 100 according to one embodiment of the present disclosure includes a transparent display panel 110, a source drive integrated circuit (IC) 210, a flexible film 220, a circuit board 230, and a timing controller 240.

The transparent display panel 110 includes a first substrate 111 and a second substrate 112, which face each other. The second substrate 112 may be an encapsulation substrate. The first substrate 111 may be a plastic film, a glass substrate, or a silicon wafer substrate formed using a semiconductor process. The second substrate 112 may be a plastic film, a glass substrate, or an encapsulation film. The first substrate 111 and the second substrate 112 may be made of (or include) a transparent material.

The gate driver supplies gate signals to the gate lines in accordance with a gate control signal which is provided from the timing controller 240. The gate driver may be provided in one side of the display area of the transparent display panel 110, or the non-display area of both peripheral sides of the transparent display panel 110 by a gate driver in panel (GIP) method. In another way, the gate driver may be manufactured in a driving chip, may be mounted on the flexible film, and may be attached to one side of the display area of the transparent display panel 110, or the non-display area of both peripheral sides of the transparent display panel 110 by a tape automated bonding (TAB) method.

The source drive IC 210 receives digital video data and source control signals from the timing controller 240. The source drive IC 210 converts the digital video data into analog data voltages in accordance with the source control signal, and supplies the analog data voltages to the data lines. If the source drive IC 210 is manufactured in a driving chip, the source drive IC 210 may be mounted on the flexible film 220 by a chip on film (COF) method or a chip on plastic (COP) method.

Pads, such as power pads and data pads, may be formed in a non-display area of the transparent display panel 110. Lines connecting the pads with the source drive IC 210 and lines connecting the pads with lines of the circuit board 230 may be formed in the flexible film 220. The flexible film 220 may be attached onto the pads using an anisotropic conducting film, whereby the pads may be connected with the lines of the flexible film 220.

Figure 2:
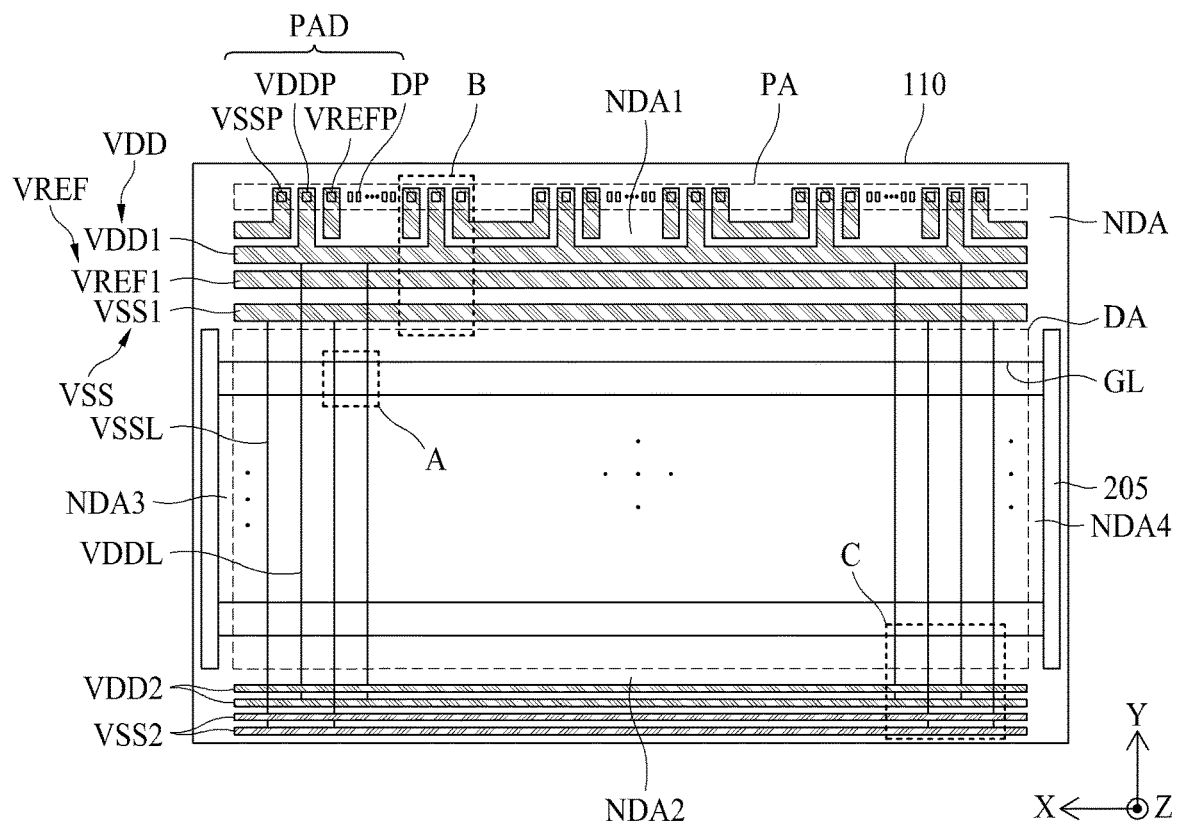
FIG. 2 is a schematic plane view illustrating a transparent display panel.
Figure 3:
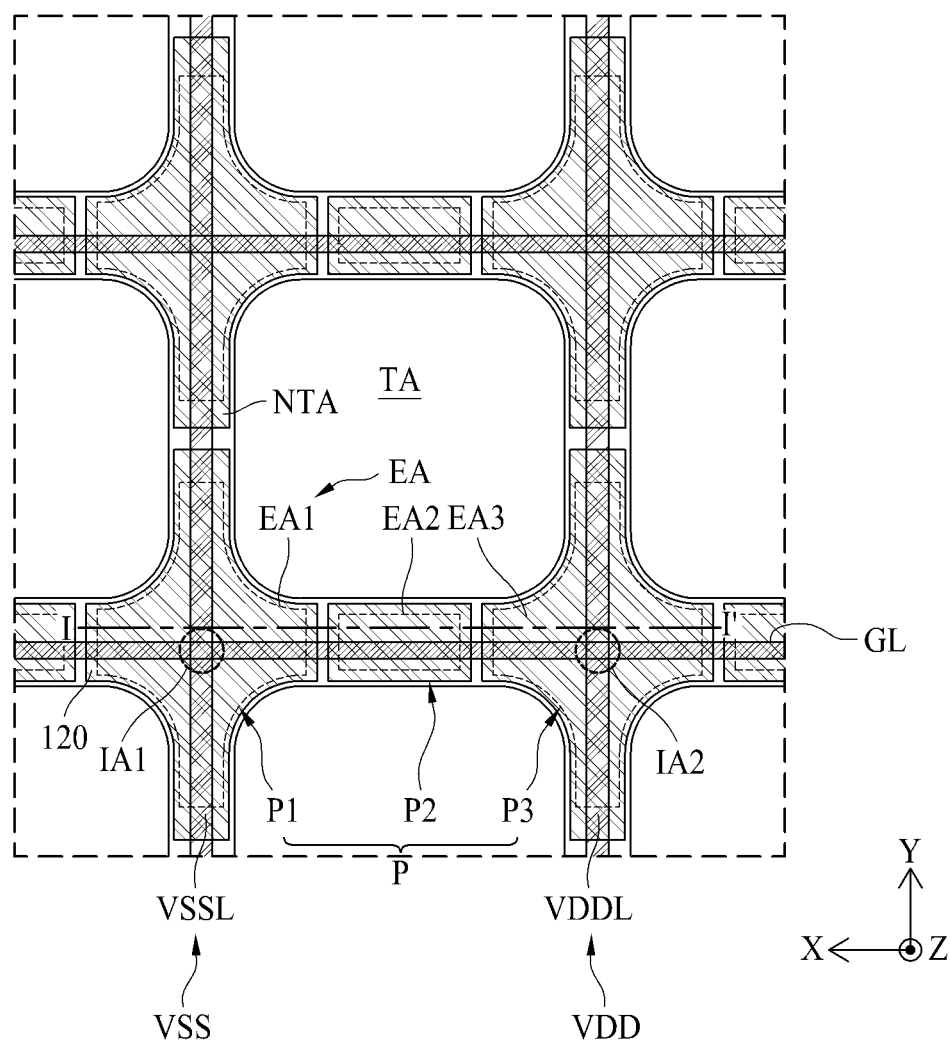
FIG. 3 is an enlarged view of an area A in FIG. 2.
Figure 4:
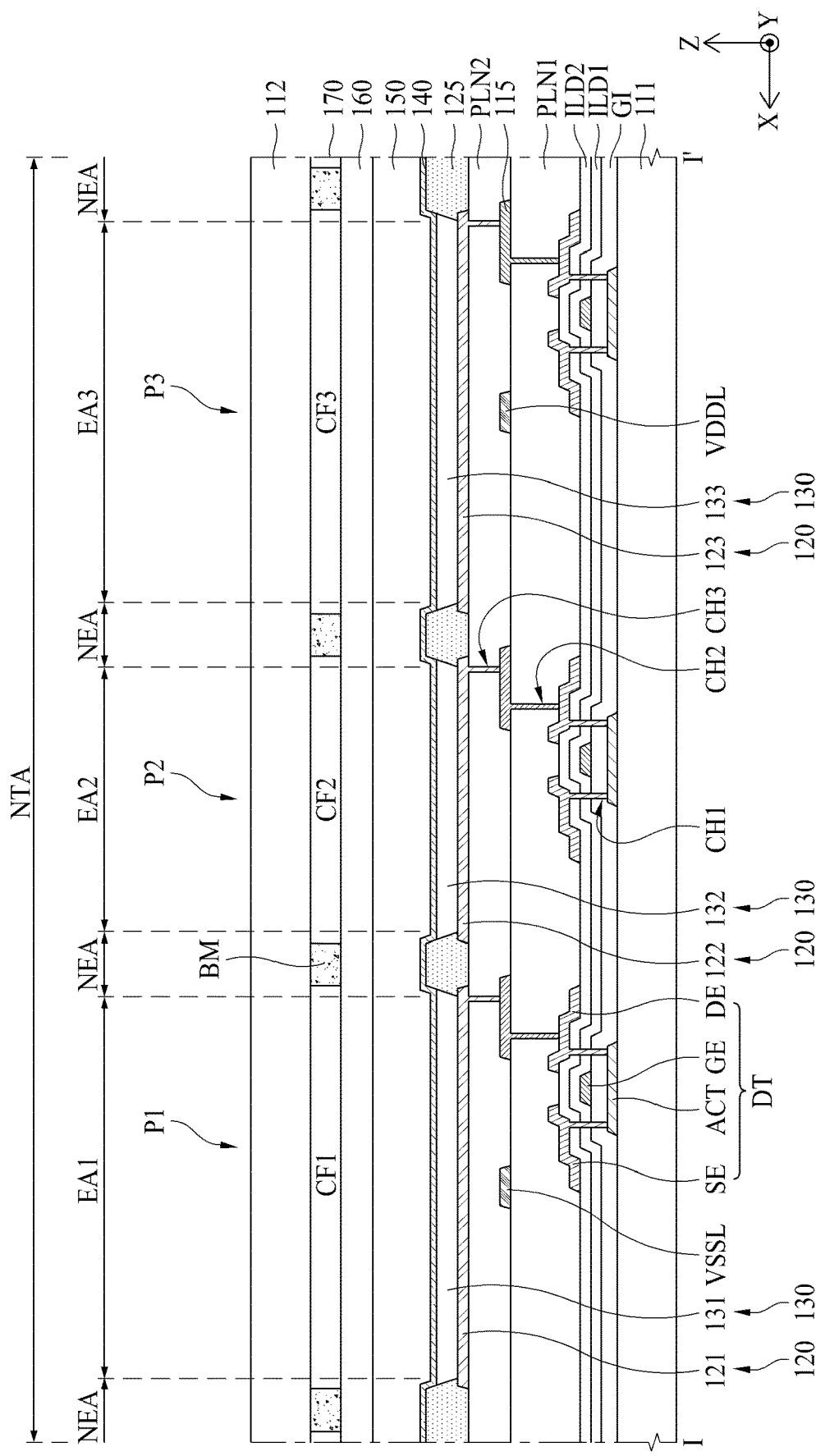
FIG. 4 is a cross-sectional view taken along line I-I' of FIG. 3.
Figure 5A:
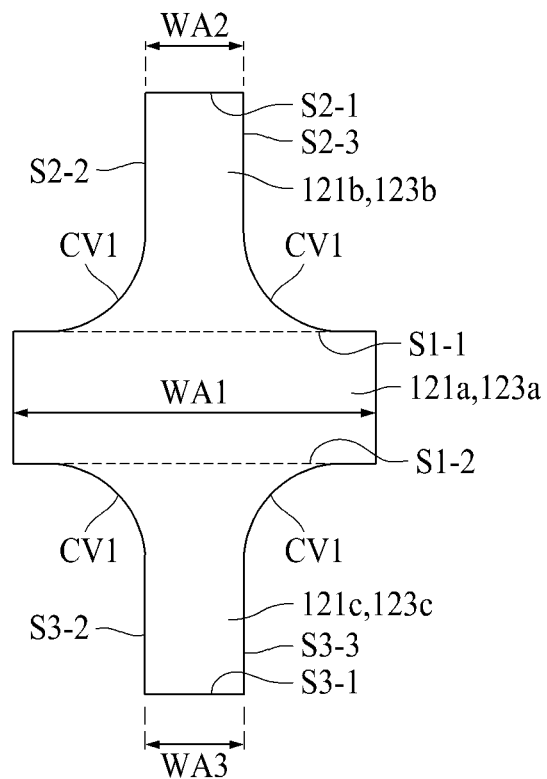
FIGS. 5A and 5B are views illustrating shapes of first, second and third anode electrodes.
Figure 5B:
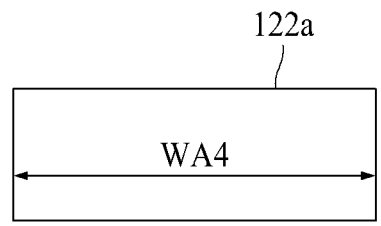

FIG. 2 is a schematic plane view illustrating a transparent display panel, FIG. 3 is an enlarged view of an area A in FIG. 2, FIG. 4 is a cross-sectional view taken along line I-I of FIG. 3, and FIGS. 5A and 5B are views illustrating shapes of first, second and third anode electrodes.

The substrate 111 may include a display area DA where pixels P are formed to display an image, and a non-display area NDA that does not display an image.

The display area DA, as shown in FIG. 3, includes a transmissive area TA and a non-transmissive area NTA. The transmissive area TA is an area through which most of externally incident light passes, and the non-transmissive area NTA is an area through which a significant amount of externally incident light fails to transmit. For example, the transmissive area TA may be an area where light transmittance is greater than α %, for example, 90%, and the non-transmissive area NTA may be an area where light transmittance is smaller than (3%, for example, 50%. Here, a is greater than β. A user may view an object or background arranged on a rear surface of the transparent display panel 110 due to the transmissive area TA.

The non-transmissive area NTA may be provided with pixel power lines VDD(VDDL), common power lines VSS (VSSL), reference lines, data lines, gate lines GL, and pixels P.

The gate lines GL may be extended in a first direction (X axis direction), and may cross the pixel power lines VDD (VDDL), the common power lines VSS(VSSL) and the data lines in the display area DA.

The pixel power lines VDD(VDDL), the common power lines VSS(VSSL), the reference lines and the data lines may be extended in a second direction (Y axis direction). Here, the pixel power lines VDD(VDDL) and the common power lines VSS(VSSL) may alternately be disposed in the display area DA. The transmissive area TA may be disposed between the pixel power line VDD(VDDL) and the common power line VSS(VSSL).

The pixels P emit predetermined light to display an image. An emission area EA may correspond to an area, from which light emits, in the pixel P.

Each of the pixels P may include a first subpixel P1, a second subpixel P2, and a third subpixel P3. The first subpixel P1 may be provided to include a first emission area EA1 emitting green light, the second subpixel P2 may be provided to include a second emission area EA2 emitting red light, and the third subpixel P3 may be provided to include a third emission area EA3 emitting blue light, but these subpixels are not limited thereto. Each of the pixels P may further include a subpixel emitting white light. An arrangement sequence of the subpixel P1, P2 and P3 may be changed in various ways.

Hereinafter, for convenience of description, a description will be given based on that the first subpixel P1 is a green subpixel emitting green light, the second subpixel P2 is a red subpixel emitting red light, and the third subpixel P3 is a blue subpixel emitting blue light.

In a first overlapping area IA1, the common power line VSS(VSSL) and the gate line GL cross each other, and in a second overlapping area IA2, the pixel power line VDD (VDDL) and the gate line GL cross each other.

For example, at least a part of the first subpixel P1, as shown in FIG. 3, may be disposed to overlap the first overlapping area IA1 where the common power line VSS (VSSL) and the gate line GL cross each other, but is not limited thereto. At least a part of the third subpixel P3 may be disposed to overlap the second overlapping area IA2 where the pixel power line VDD(VDDL) and the gate line GL cross each other, but is not limited thereto. The first subpixel P1 may be disposed to overlap the second overlapping area IA2, and the third subpixel P3 may be disposed to overlap the first overlapping area IA1. Also, the first subpixel P1 and the s third subpixel P3 may be disposed alternately along the common power line VSS(VSSL), or may be disposed alternately along the pixel power line VDD(VDDL).

The second subpixel P2 may be disposed between the first overlapping area IA1 and the second overlapping area IA2. For example, the second subpixel P2 may be disposed between the first subpixel P1 and the third subpixel P3. Here, at least a part of the second subpixel P2 may be overlapped with the gate line GL.

Each of the first subpixel P1, the second subpixel P2 and the third subpixel P3 may include a circuit element that includes a capacitor, a thin film transistor, etc., and a light emitting diode. The thin film transistor may include a switching transistor, a sensing transistor, and a driving transistor DT.

The switching transistor is switched in accordance with a gate signal supplied to the gate line GL and serves to supply a data voltage supplied from the data line to the driving transistor DT.

The sensing transistor serves to sense a threshold voltage deviation of the driving transistor DT, which is a cause of image quality degradation.

The driving transistor DT is switched in accordance with the data voltage supplied from the switching transistor to generate a data current from a power source supplied from the pixel power line VDD(VDDL), and serves to supply the generated data current to the anode electrode 120 of the pixel.

The driving transistor DT includes an active layer ACT, a gate electrode GE, a source electrode SE, and a drain electrode DE.

The capacitor maintains a data voltage supplied to the driving transistor DT for one frame. The capacitor includes a first capacitor electrode and a second capacitor electrode.

In detail, the active layer ACT may be provided over the first substrate 111. The active layer ACT may be formed of a silicon based semiconductor material or an oxide based semiconductor material. A buffer layer (not shown) may be provided between the active layer ACT and the first substrate 111.

A gate insulating layer GI may be provided over the active layer ACT. The gate insulating layer GI may be formed an inorganic film, for example, a silicon oxide (SiOx) film, a silicon nitride (SiNx) film, or a multi-layered film of SiOx and SiNx.

A gate electrode GE and the first capacitor electrode may be provided over the gate insulating layer GI. The gate electrode GE and the first capacitor electrode may be formed of a single layer or a multi-layer made of (or including) any one of Mo, Al, Cr, Au, Ti, Ni, Nd and Cu or their alloy.

A first inter-layer insulating layer ILD1 may be provided over the gate electrode GE and the first capacitor electrode. The first inter-layer insulating layer ILD1 may be formed an inorganic layer, for example, a silicon oxide (SiOx) layer, a silicon nitride (SiNx) layer, or a multi-layered layer of SiOx and SiNx.

The second capacitor electrode may be provided over the first inter-layer insulating layer ILD1. The second capacitor electrode may be formed of a single layer or a multi-layer made of (or including) any one of Mo, Al, Cr, Au, Ti, Ni, Nd and Cu or their alloy.

A second inter-layer insulating layer ILD2 may be provided over the second capacitor electrode. The second inter-layer insulating layer ILD2 may be formed an inorganic layer, for example, a silicon oxide (SiOx) layer, a silicon nitride (SiNx) layer, or a multi-layered layer of SiOx and SiNx.

The source electrode SE and the drain electrode DE may be provided over the second inter-layer insulating layer ILD2. The source electrode SE and the drain electrode DE may be connected to the active layer ACT through a first contact hole CH1 that passes through the gate insulating film GI, the first inter-layer insulating layer ILD1 and the second inter-layer insulating layer ILD2.

The source and drain electrodes SE and DE may be formed of a single layer or a multi-layer made of (or including) any one of Mo, Al, Cr, Au, Ti, Ni, Nd and Cu or their alloy.

A first planarization layer PLN1 may be provided over the source and drain electrodes SE and DE to planarize a step difference caused by the driving transistor DT. The first planarization layer PLN1 may be formed of an organic layer, for example, acryl resin, epoxy resin, phenolic resin, polyamide resin, polyimide resin, etc.

An anode auxiliary electrode 115 may be provided over the first planarization layer PLN1. The anode auxiliary electrode 115 may be connected to one of the source and drain electrodes SE and DE through a second contact hole CH2 that passes through the first planarization layer PLN1. For example, the anode auxiliary electrode 115 may be connected to the drain electrode DE through the second contact hole CH2 that passes through the first planarization layer PLN1.

The anode auxiliary electrode 115 may be formed of a single layer or a multi-layer made of (or including) any one of Mo, Al, Cr, Au, Ti, Ni, Nd and Cu or their alloy.

A second planarization layer PLN2 may be formed over the anode auxiliary electrode 115. The second planarization layer PLN2 may be formed of an organic layer, for example, acryl resin, epoxy resin, phenolic resin, polyamide resin, polyimide resin, etc.

Light emitting diodes formed of the anode electrode 120, the light emitting layer 130 and the cathode electrode 140 and the bank 125 are provided over the second planarization film PLN2.

The anode electrode 120 may be provided over the second planarization film PLN2 and thus connected with the driving transistor DT. In detail, the anode electrode 120 may be connected to the anode auxiliary electrode 115 through a third contact hole CH3 that passes through the second planarization film PLN2. Since the anode auxiliary electrode 115 is connected to the source electrode SE or the drain electrode DE of the driving transistor DT through a second contact hole CH2, the anode electrode 120 may electrically be connected with the driving transistor DT.

The anode electrode 120 may be provided for each of the subpixels P1, P2 and P3. In detail, one anode electrode 120 may be formed in the first subpixel P1, another anode electrode 120 may be formed in the second subpixel P2, and other anode electrode 120 may be formed in the third subpixel P3.

The anode electrode 120 according to one embodiment of the present disclosure may include a first anode electrode 121, a second anode electrode 122 and a third anode electrode 123.

The first anode electrode 121 may be disposed over the common power line VSS(VSSL). In detail, at least a part of the first anode electrode 121 may be disposed to overlap the first overlapping area IA1 where the common power line VSS(VSSL) and the gate line GL cross (or overlap) each other.

The first anode electrode 121 may be provided over the common power line VSS(VSSL) in a plural number along the common power line VSS(VSSL). The subpixels provided with the plurality of first anode electrodes 121 may be at least one of the first subpixel P1 and the third subpixel P3. For example, the subpixels provided with the plurality of first anode electrodes 121 may be the first subpixels P1. For another example, the subpixels provided with the plurality of first anode electrodes 121 may be the third subpixels P3. For other example, the subpixels provided with the plurality of first anode electrodes 121 may be the first subpixels P1 and the third subpixels P3. Here, the first subpixels P1 and the third subpixels P3 may alternately be disposed over the common power line VSS(VSSL).

The third anode electrode 123 may be disposed over the pixel power line VDD(VDDL). In detail, at least a part of the third anode electrode 123 may be disposed to overlap the second overlapping area IA2 where the pixel power line VDD(VDDL) and the gate line GL cross each other.

The third anode electrode 123 may be provided over the pixel power line VDDL in a plural number along the pixel power line VDD(VDDL). The subpixels provided with the plurality of third anode electrodes 123 may be at least one of the first subpixel P1 and the third subpixel P3. For example, the subpixels provided with the plurality of third anode electrodes 123 may be the first subpixels P1. For another example, the subpixels provided with the plurality of third anode electrodes 123 may be the third subpixels P3. For other example, the subpixels provided with the plurality of third anode electrodes 123 may be the first subpixels P1 and the third subpixels P3. Here, the first subpixels P1 and the third subpixels P3 may alternately be disposed over the pixel power line VDD(VDDL).

The second anode electrode 122 may be disposed between the first anode electrode 121 and the third anode electrode 123. In detail, the second anode electrode 122 may be disposed over the gate line GL provided between the first overlapping area IA1 and the second overlapping area IA2.

The first anode electrode 121 and the third anode electrode 123 may have shapes different from a shape of the second anode electrode 122.

In detail, each of the first anode electrode 121 and the third anode electrode 123, as shown in FIG. 5A, may include first portions 121a and 123a and second portions 121b and 123b. In one embodiment, the first anode electrode 121 and the third anode electrode 123 may further include third portions 121c and 123c. The first portions 121a and 123a of the first anode electrode 121 and the third anode electrode 123 may be disposed to overlap the first overlapping area IA1 where the common power line VSS(VSSL) and the gate line GL cross each other. For example, the first portions 121a and 123a of the first anode electrode 121 and the third anode electrode 123 may have a rectangular shape but are not limited thereto. The first portions 121a and 123a of the first anode electrode 121 and the third anode electrode 123 may be formed in various shapes such as a circle, a semi-circle, and a polygonal shape.

The first portions 121a and 123a of the first anode electrode 121 and the third anode electrode 123 may be provided with a thin film transistor, such as a switching transistor, a sensing transistor, and a driving transistor DT, and a capacitor therebelow. The first portions 121a and 123a of the first anode electrode 121 and the third anode electrode 123 may have a predetermined width WA1 to partially overlay the thin film transistor and the capacitor, which are provided therebelow.

The second portions 121b and 123b of the first anode electrode 121 and the third anode electrode 123 may be protruded from one side S1-1 of the first portions 121a and 123a. Here, the second portions 121b and 123b of the first anode electrode 121 and the third anode electrode 123 may be disposed over the common power line VSS(VSSL). The second portions 121b and 123b of the first anode electrode 121 and the third anode electrode 123 may be protruded toward a direction where the common power line VSS (VSSL) is extended, that is, a second direction (Y axis direction).

The second portions 121b and 123b of the first anode electrode 121 and the third anode electrode 123 may include a first side S2-1 facing the first portions 121a and 123a, and second and third sides S2-2 and S2-3 connecting the first side S2-1 with the first portions 121a and 123a.

The second portions 121b and 123b of the first anode electrode 121 and the third anode electrode 123 may have a width WA2 at the first side S2-1, which is narrower than the width WA1 of the first portions 121a and 123a. The second portions 121b and 123b of the first anode electrode 121 and the third anode electrode 123 may be provided with a plurality of metal lines therebelow, for example, power lines such as a common power line VSS(VSSL) or a pixel power line VDD(VDDL), data lines, and reference lines. Here, the common power line VSS(VSSL), the data lines, and the reference lines may be disposed in parallel in the same direction, that is, a second direction (Y axis direction). Therefore, the second portions 121b and 123b of the first anode electrode 121 and the third anode electrode 123 may overlay the plurality of metal lines by the width WA2 narrower than the width WA1 of the first portions 121a and 123a.

Meanwhile, the second portions 121b and 123b of the first anode electrode 121 and the third anode electrode 123, as shown in FIG. 5A, may be provided with a first curved portion CV1 between the first side S2-1 and the first portions 121a and 123a. In detail, the second portions 121b and 123b of the first anode electrode 121 and the third anode electrode 123 may include second and third sides S2-2 and S2-3 connecting the first side S2-1 with the first portion 121a and 123a. The second side S2-2 of the second portions 121b and 123b of the first anode electrode 121 and the third anode electrode 123 may include one first curved portion CV1 connected from one point to the first portions 121a and 123a by a curve. Also, the third side S2-3 of the second portions 121b and 123b of the first anode electrode 121 and the third anode electrode 123 may include another one first curved portion CV1 connected from one point to the first portions 121a and 123a by a curve. Here, the first curved portion CV1 may be recessed toward an inward direction.

The third portions 121c and 123c of the first anode electrode 121 and the third anode electrode 123 may be protruded from the other side S1-2 of the first portions 121a and 123a. Here, the third portions 121c and 123c of the first anode electrode 121 and the third anode electrode 123 may be disposed over the common power line VSS(VSSL). The third portions 121c and 123c of the first anode electrode 121 and the third anode electrode 123 may be protruded toward a direction where the common power line VSS(VSSL) is extended, that is, a second direction (Y axis direction).

The third portions 121c and 123c of the first anode electrode 121 and the third anode electrode 123 may include a first side S3-1 facing the first portions 121a and 123a, and second and third sides S3-2 and S3-3 connecting the first side S3-1 with the first portions 121a and 123a.

The third portions 121c and 123c of the first anode electrode 121 and the third anode electrode 123 may have a width WA3 at the first side S3-1, which is narrower than the width WA1 of the first portions 121a and 123a. The third portions 121c and 123c of the first anode electrode 121 and the third anode electrode 123 may be provided with a plurality of metal lines therebelow, for example, power lines such as a common power line VSS(VSSL) or a pixel power line VDD(VDDL), data lines, and reference lines. Here, the common power line VSSL, the data lines and the reference lines may be disposed in parallel in the same direction, that is, a second direction (Y axis direction). Therefore, the third portions 121c and 123c of the first anode electrode 121 and the third anode electrode 123 may overlay the plurality of metal lines by the width WA3 narrower than the width WA1 of the first portions 121a and 123a.

The third portions 121c and 123c of the first anode electrode 121 and the third anode electrode 123 and the second portions 121b and 123b of the first anode electrode 121 and the third anode electrode 123 may have symmetric shapes by interposing the first portions 121a and 123a.

Meanwhile, the third portions 121c and 123c of the first anode electrode 121 and the third anode electrode 123, as shown in FIG. 5A, may be provided with a first curved portion CV1 between the first side S3-1 and the first portions 121a and 123a. In detail, the third portions 121c and 123c of the first anode electrode 121 and the third anode electrode 123 may include second and third sides S3-2 and S3-3 connecting the first side S3-1 with the first portions 121a and 123a. The second side S3-2 of the third portions 121c and 123c of the first anode electrode 121 and the third anode electrode 123 may include one first curved portion CV1 connected from one point to the first portions 121a and 123a by a curve. Also, the third side S3-3 of the third portions 121c and 123c of the first anode electrode 121 and the third anode electrode 123 may include another one first curved portion CV1 connected from one point to the first portions 121a and 123a by a curve. Here, the curved portion CV may be recessed toward an inward direction.

Meanwhile, in some embodiments, the second anode electrode 122, as shown in FIG. 5B, may be provided with the first portion 122a only. The first portion 122a of the second anode electrode 122, as shown in FIG. 5B, may have a rectangular shape but is not limited thereto. The first portion 122a of the second anode electrode 122 may be formed in various shapes such as a circle, a semi-circle, and a polygonal shape.

The first portion 122a of the second anode electrode 122 may be provided with a thin film transistor, such as a switching transistor, a sensing transistor and a driving transistor DT, and a capacitor therebelow. The first portion 122a of the second anode electrode 122 may have a width WA4 that may overlay the thin film transistor and the capacitor, which are provided therebelow. The width WA4 of the first portion 122a of the second anode electrode 122 may be narrower than the width WA1 of the first portions 121a and 123a of the first and third anode electrodes 121 and 123 but is not limited thereto. The width WA4 of the first portion 122a of the second anode electrode 122 may be equal to the width WA1 of the first portions 121a and 123a of the first and third anode electrodes 121 and 123.

The second anode electrode 122 may have an area smaller than those of the first anode electrode 121 and the third anode electrode 123. Therefore, the second subpixel P2 provided with the second anode electrode 122 may have a light emission area smaller than those of the first subpixel P1 and the third subpixel P3 provided with the first anode electrode 121 or the third anode electrode 123. In one embodiment, the second subpixel P2 may be a red subpixel emitting red light. Generally, since the red subpixel has lifetime more excellent than a green subpixel and a blue subpixel, even though the red subpixel is formed with a small area, lifetime of the transparent display panel 110 may not be reduced.

In the transparent display panel 110 according to one embodiment of the present disclosure, the first anode electrode 121 and the third anode electrode 123 may include first portions 121a and 123a, and second portions 121b and 123b and third portions 121c and 123c protruded from the first portions 121a and 123a in the second direction (Y axis direction).

Here, the second portions 121b and 123b and the third portions 121c and 123c may overlay the plurality of metal lines provided therebelow and extended in the second direction (Y axis direction). Here, the plurality of metal lines may be disposed to be spaced apart from each other on the same layer. For example, the data lines and the reference lines may be spaced apart from each other on the same layer as the source electrode SE and the drain electrode DE of the driving transistor DT. The common power line VSS(VSSL) or the pixel power line VDD(VDDL) may be disposed on the same layer as the anode auxiliary electrode 115.

If these metal lines are disposed in parallel to be spaced apart from each other, a slit, specifically a long linear or rectangular shape may be formed between the metal lines. If external light passes through the slit, diffraction may occur.

Diffraction may mean that interference occurs in spherical waves after plane waves are changed to the spherical waves as light passes through the slit. Therefore, as interpolation interference and destructive interference occur in the spherical waves, the external light that has passed through the slit may have irregular light intensity. As a result, definition of an object or image arranged at an opposite side of the transparent display panel 110 may be reduced.

In the transparent display panel 110 according to one embodiment of the present disclosure, the second portions 121b and 123b and the third portions 121c and 123c protruded from the first portions 121a and 123a in the second direction (Y axis direction) may be formed in the first anode electrode 121 and the third anode electrode 123 to overlay the plurality of metal lines provided below the first anode electrode 121 and the third anode electrode 123 if possible. Therefore, the transparent display panel 110 according to one embodiment of the present disclosure may prevent diffraction from occurring due to the plurality of metal lines.

Moreover, the transparent display panel 110 according to one embodiment of the present disclosure may increase an area of an emission area EA by forming the second portions 121b and 123b and the third portions 121c and 123c in the first anode electrode 121 and the third anode electrode 123.

Each of the first anode electrode 121 and the third anode electrode 123 may be formed of a metal material of high reflectivity such as a deposited structure (Ti/Al/Ti) of aluminum and titanium, a deposited structure (ITO/Al/ITO) of aluminum and ITO, an Ag alloy and a deposited structure (ITO/Ag alloy/ITO) of Ag alloy and ITO. The Ag alloy may be an alloy of silver (Ag), palladium (Pb), and Copper (Cu).

A bank 125 may be provided over a second planarization layer PLN2. Also, the bank 125 may be provided among the anode electrodes 120. In detail, the bank 125 may be provided among the first anode electrode 121, the second anode electrode 122 and the third anode electrode 123, which are disposed to adjoin one another in the first direction (X axis direction). Also, the bank 125 may be provided among a plurality of first anode electrodes 121 disposed over the common power line VSS(VSSL) along the second direction (Y axis direction). Also, the bank 125 may be provided among a plurality of third anode electrodes 123 disposed over the pixel power line VDD(VDDL) along the second direction (Y axis direction)

The bank 125 may be formed to overlay each edge of the first anode electrode 121, the second anode electrode 122 and the third anode electrode 123 and partially expose each of the first anode electrode 121, the second anode electrode 122 and the third anode electrode 123. Therefore, the bank 125 may prevent light emitting efficiency from being deteriorated due to a current concentrated on the ends of the first anode electrode 121, the second anode electrode 122 and the third anode electrode 123.

The bank 125 may respectively define emission areas EA1, EA2, and EA3 of the subpixels P1, P2 and P3. In this case, the area where the bank 125 is not formed and the anode electrode 120 is exposed may be an emission area EA, and the other area may be a non-emission area NEA.

The bank 125 may be formed of an organic film, for example, acryl based material, epoxy based material, phenolic based material, polyamide based material, polyimide based material, etc.

The organic light emitting layer 130 may be provided over the anode electrode 120. The organic light emitting layer 130 may include a hole transporting layer, a light emitting layer, and an electron transporting layer. In this case, if a voltage is applied to the anode electrode 120 and the cathode electrode 140, holes and electrons move to the light emitting layer through the hole transporting layer and the electron transporting layer, respectively, and are combined with each other in the light emitting layer to emit light.

The organic light emitting layer 130, as shown in FIG. 4, may include light emitting layers each of which is formed for each of the subpixels P1, P2 and P3. For example, a green light emitting layer 131 emitting green light may be formed in the first subpixel P1, a red light emitting layer 132 emitting red light may be formed in the second subpixel P2, and a blue light emitting layer 133 emitting blue light may be formed in the third subpixel P3. In this case, the light emitting layers of the organic light emitting layer 130 are not formed in the transmissive area TA.

The cathode electrode 140 may be provided over the organic light emitting layer 130 and the bank 125. The cathode electrode 140 may be provided in the transmissive area TA as well as the non-transmissive area NTA that includes the emission area EA, but is not limited thereto. In some embodiments, the cathode electrode 140 may be provided in the non-transmissive area NTA that includes the emission area EA, and may not be provided in the transmissive area TA to improve transmittance.

The cathode electrode 140 may be a common layer commonly formed for the subpixels P1, P2 and P3 to apply the same voltage to the subpixels P1, P2 and P3. The cathode electrode 140 may be formed of a transparent conductive material (TCO) such as ITO and IZO, which can transmit light, or may be formed of a semi-transmissive conductive material such as Mg, Ag, or alloy of Mg and Ag. If the cathode electrode 140 is formed of a semi-transmissive conductive material, emission efficiency may be enhanced by micro cavity.

An encapsulation layer 150 may be provided over the light emitting diodes. The encapsulation layer 150 may be formed over the cathode electrode 140 to overlay the cathode electrode 140. The encapsulation layer 150 serves to prevent oxygen or water from being permeated into the organic light emitting layer 130 and the cathode electrode 140. Accordingly, in some embodiments, the encapsulation layer 150 may include at least one inorganic film and at least one organic film.

Meanwhile, although not shown in FIG. 4, a capping layer may additionally be formed between the cathode electrode 140 and the encapsulation layer 150.

A color filter layer 170 may be provided over the encapsulation layer 150. The color filter layer 170 may be provided over one surface of the second substrate 112 that faces the first substrate 111. In this case, the first substrate 111 provided with the encapsulation layer 150 and the second substrate 112 provided with the color filter layer 170 may be bonded to each other by an adhesive layer 160. Here, the adhesive layer 160 may be an optically clear resin (OCR) layer or an optically clear adhesive (OCA) film.

The color filter layer 170 may be formed to be patterned for each of the subpixels P1, P2 and P3. In detail, the color filter layer 170 may include a first color filter CF1, a second color filter CF2, and a third color filter CF3. The first color filter CF1 may be disposed to correspond to the emission area EA1 of the first subpixel P1, and may be a green color filter that transmits green light. The second color filter CF2 may be disposed to correspond to the emission area EA2 of the second subpixel P2, and may be a red color filter that transmits red light. The third color filter CF3 may be disposed to correspond to the emission area EA3 of the third subpixel P3, and may be a blue color filter that transmits blue light.

The transparent display panel 110 according to one embodiment of the present disclosure is characterized in that a polarizer is not used, and the color filter layer 170 is formed in the second substrate 112. If the polarizer is attached to the transparent display panel 110, transmittance of the transparent display panel 110 is reduced by the polarizer. Meanwhile, if the polarizer is not attached to the transparent display panel 110, a problem occurs in that externally incident light is reflected towards the electrodes.

Since a polarizer is not attached to the transparent display panel 110 according to one embodiment of the present disclosure, transmittance may be prevented from being reduced. Also, in the transparent display panel 110 according to one embodiment of the present disclosure, the color filter layer 170 may be formed in the second substrate 112 to partially absorb externally incident light, thereby preventing the incident light from being reflected toward the electrodes. That is, the transparent display panel 110 according to one embodiment of the present disclosure may reduce external light reflectivity without reducing transmittance.

Meanwhile, a black matrix BM may be provided among the color filters CF1, CF2 and CF3. The black matrix BM may be provided among the subpixels P1, P2 and P3 to prevent color mixture among the adjacent subpixels P1, P2 and P3 from occurring. Also, the black matrix BM may prevent externally incident light from being reflected toward a plurality of lines provided among the subpixels P1, P2 and P3, for example, the gate lines, the data lines, the pixel power lines, the common power lines, the reference lines, etc.

The black matrix BM may include a material that absorbs light, for example, a black dye that absorbs light of a visible light wavelength range.

In some embodiments, the color filter layer 170 may define a non-transmissive area NTA in the display area DA. In detail, the area where the color filters CF1, CF2 and CF3 and the black matrix BM is provided may be the non-transmissive area NTA, and the other area may be the transmissive area TA.

Hereinafter, the area where the capacitor, the driving transistor DT, the first and second inter-layer insulating layers ILD1 and ILD2, the anode electrode 120 and the bank 125 are provided in the non-transmissive area NTA will be described in more detail with reference to FIGS. 6 to 7.

Figure 6:
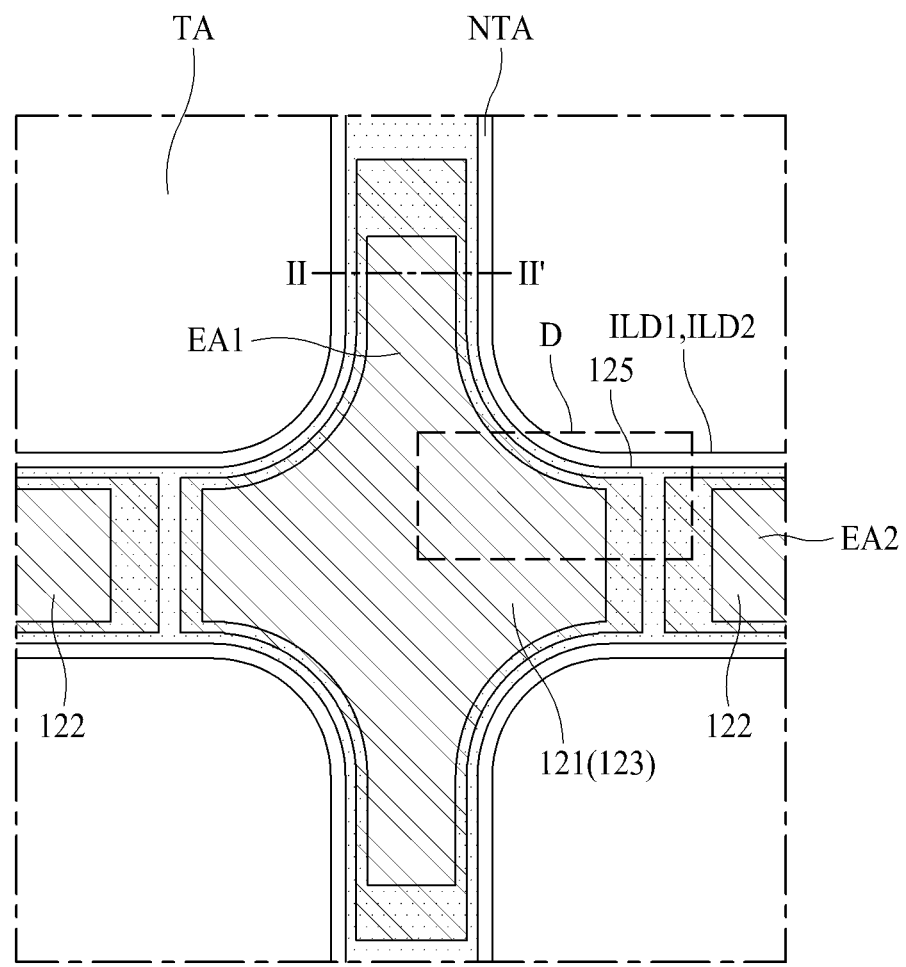
FIG. 6 is a plane view illustrating an anode electrode, a first inter-layer insulating layer, a second inter-layer insulating layer, and a bank.
Figure 7:
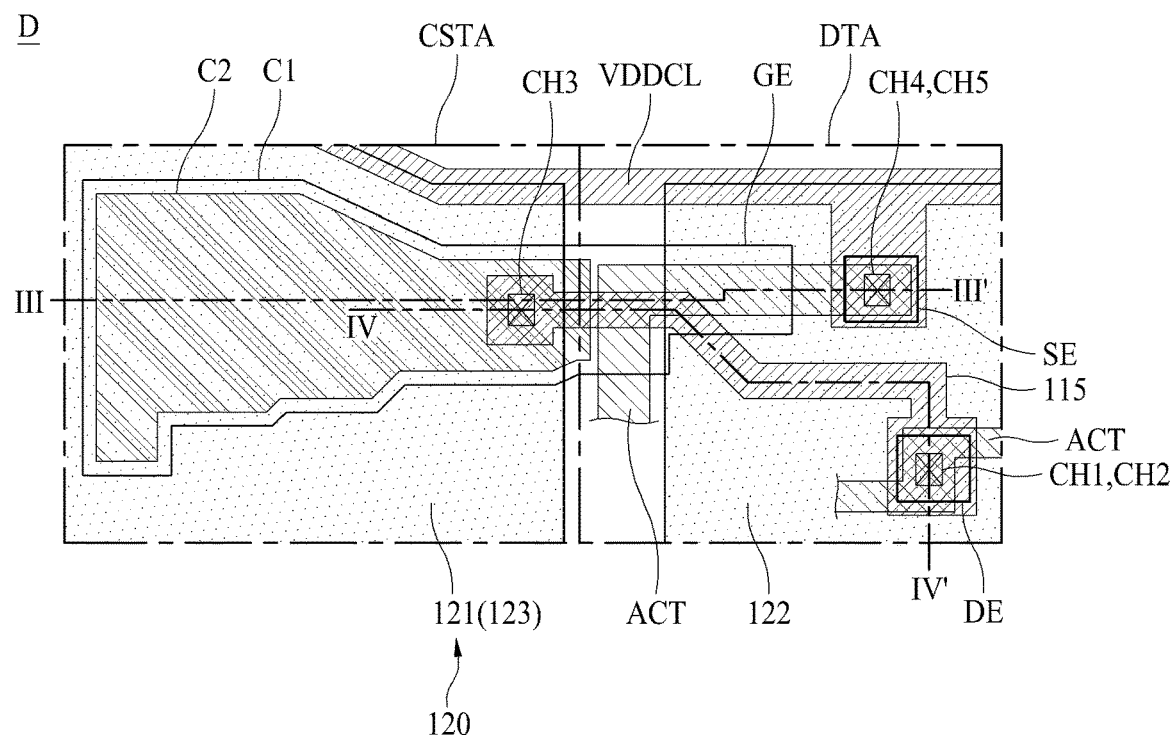
FIG. 7 is a view illustrating a driving transistor and a capacitor, which are provided in an area D of FIG. 6.
Figure 8:
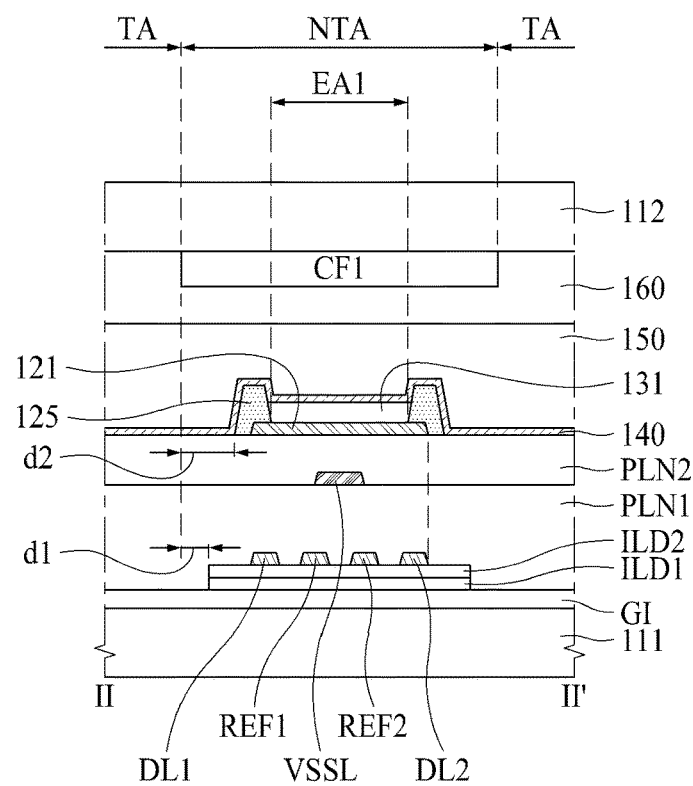
FIG. 8 is a cross-sectional view taken along line II-IF of FIG. 6.
Figure 9:
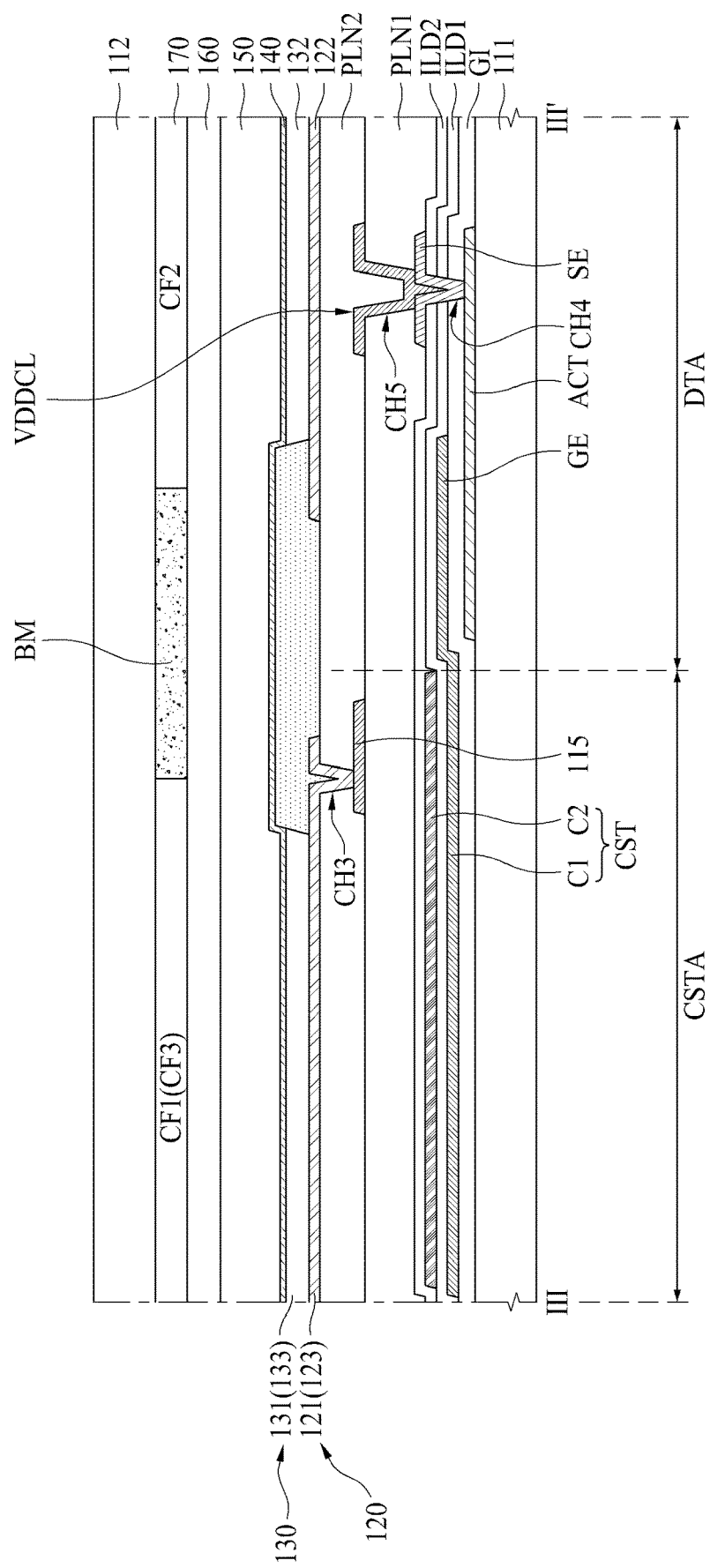
FIG. 9 is a cross-sectional view taken along line of FIG. 7.
Figure 10:
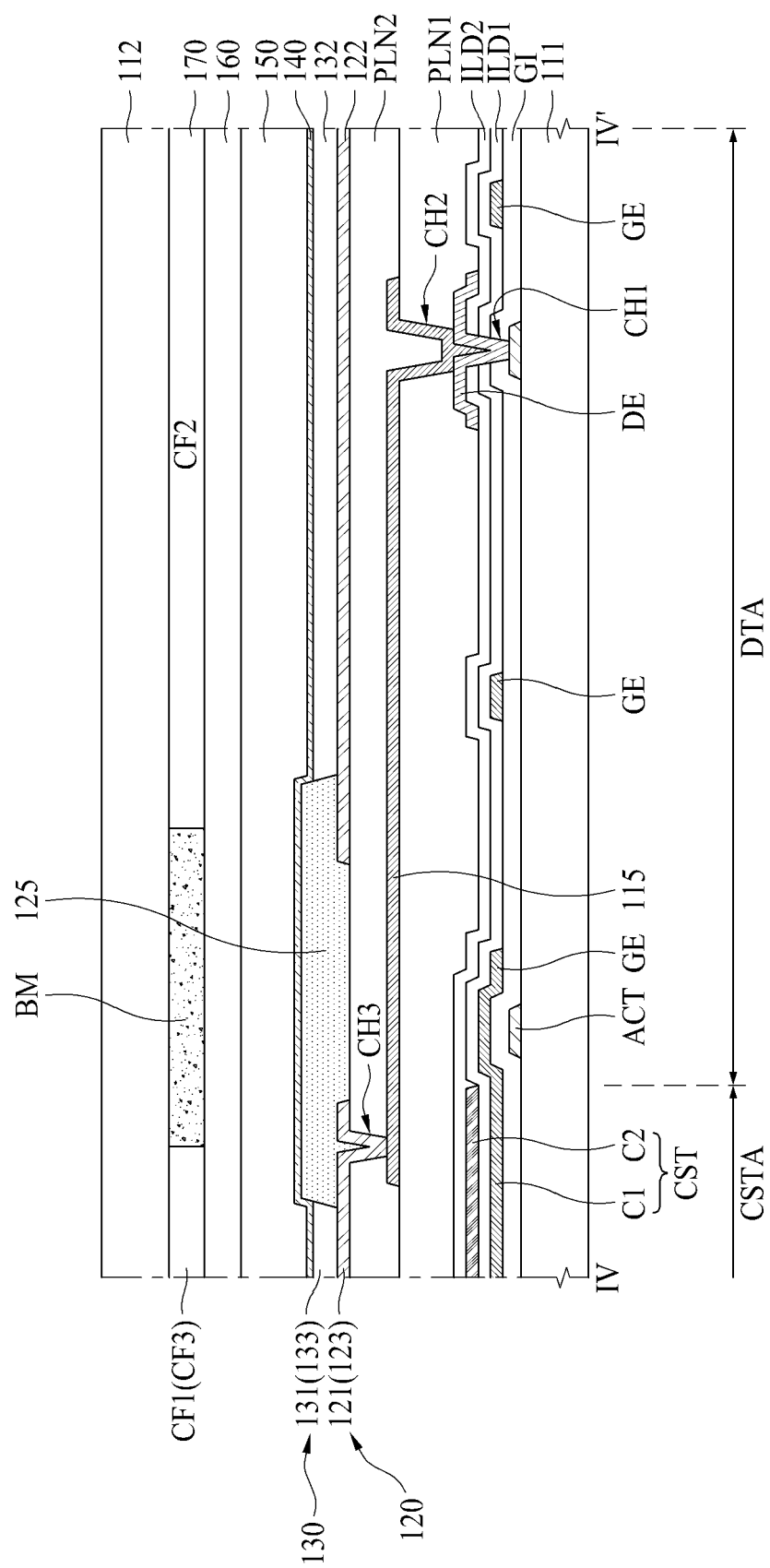
FIG. 10 is a cross-sectional view taken along line IV-IV' of FIG. 7.

FIG. 6 is a plane view illustrating an anode electrode, a first inter-layer insulating layer, a second inter-layer insulating layer and a bank, FIG. 7 is a view illustrating a driving transistor and a capacitor, which are provided in an area D of FIG. 6, FIG. 8 is a cross-sectional view taken along line II-II of FIG. 6, FIG. 9 is a cross-sectional view taken along line of FIG. 7, and FIG. 10 is a cross-sectional view taken along line IV-IV of FIG. 7.

The capacitor CST, the driving transistor DT, the first and second inter-layer insulating layers ILD1 and ILD2, the anode electrode 120 and the bank 125 may be provided in the non-transmissive area NTA.

Referring to FIGS. 2, 6 and 7, the capacitor CST and the driving transistor DT may be disposed between the pixel power line VDD(VDDL) and the common power line VSS (VSSL). In more detail, the capacitor CST and the driving transistor DT may be provided between the first overlapping area IA1 where the common power line VSS(VSSL) and the gate line GL cross each other and the second overlapping area IA2 where the pixel power line VDD(VDDL) and the gate line GL cross each other.

The non-transmissive area NTA may include a first area DTA provided with the driving transistor DT, and a second area CSTA provided with the capacitor CST.

The driving transistor DT, as shown in FIGS. 7, 9 and 10, may be disposed in the first area DTA, and may include an active layer ACT, a gate electrode GE, a source electrode SE and a drain electrode DE.

The active layer ACT of the driving transistor DT may be provided over the first substrate 111. The gate electrode GE of the driving transistor DT may be provided to partially overlap the active layer ACT over the gate insulating film GI.

The source electrode SE of the driving transistor DT may be provided over the second inter-layer insulating layer ILD2 and connected to the active layer ACT through a fourth contact hole CH4 that passes through the gate insulating layer GI, the first inter-layer dielectric layer ILD1 and the second inter-layer dielectric layer ILD2. The drain electrode DE of the driving transistor DT may be connected to the active layer ACT through a first contact hole CH1 that passes through the gate insulating film GI, the first inter-layer insulating layer ILD1 and the second inter-layer insulating layer ILD2.

Also, the drain electrode DE of the driving transistor DT may be connected to a pixel power connection line VDDCL diverged from the pixel power line VDDL. The pixel power connection line VDDCL may be provided over the first planarization film PLN1, and may be connected to the source electrode SE through a fifth contact hole CH5 that passes through the first planarization film PLN1.

The drain electrode DE of the driving transistor DT may be provided over the second inter-layer insulating layer ILD2. The drain electrode DE of the driving transistor DT may be connected to the active layer ACT through the first contact hole CH1 that passes through the gate insulating film GI, the first inter-layer insulating layer ILD1 and the second inter-layer insulating layer ILD2.

Also, the drain electrode DE of the driving transistor DT may be connected to the anode auxiliary electrode 115. The anode auxiliary electrode 115 may be provided over the first planarization film PLN1, and may have one end connected to the drain electrode DE and the other end connected to the anode electrode 120. The anode auxiliary electrode 115 may be connected to the drain electrode DE through a second contact hole CH2 that passes through the first planarization film PLN1. Also, the anode auxiliary electrode 115 may be connected to the anode electrode 120 through a third contact hole CH3 that passes through the second planarization film PLN2.

The capacitor CST, as shown in FIGS. 7, 9 and 10, may be disposed in the second area CSTA, and may include a first capacitor electrode C1 and a second capacitor electrode C2.

The first capacitor electrode C1 may be provided over the gate insulating film GI. Here, the first capacitor electrode C1 may be extended from the gate electrode GE of the driving transistor DT.

The second capacitor electrode C2 may be provided over the first inter-layer insulating layer ILD2 to overlap the first capacitor electrode C1. The second capacitor electrode C2 according to one embodiment of the present disclosure is not overlapped with the driving transistor DT. Particularly, the second capacitor electrode C2 may be formed so as not to overlap the active layer ACT of the driving transistor DT.

The active layer ACT may be formed by crystallizing a silicon based semiconductor material or an oxide based semiconductor material through growth of a crystal. Since the crystallized active layer ACT is formed with a rough surface, layers provided between the active layer ACT and the first planarization film PLN1 may be formed along the rough surface.

In detail, the gate insulating film GI provided over the active layer ACT may be formed along the rough surface of the active layer ACT. The gate electrode GE, the first capacitor electrode C1, the first inter-layer insulating layer ILD1 and the second capacitor electrode C2, which are provided over the gate insulating film GI, may be formed with rough surfaces.

The insulating layers and the electrodes deposited with high roughness may not be deposited with a certain thickness.

For example, the gate insulating film GI may not be deposited on the rough surface at a certain thickness, and the active layer ACT may partially be exposed. In this case, the gate electrode GE or the first capacitor electrode C1 deposited on the gate insulating film GI may be connected with some of the exposed active layer ACT, whereby a short circuit may occur.

For another example, the first inter-layer insulating layer ILD1 may not be deposited on the rough surface at a certain thickness, and the gate electrode GE or the first capacitor electrode C1 may partially be exposed. In this case, the second capacitor electrode C2 deposited on the first inter-layer insulating layer ILD1 may be connected with some of the exposed gate electrode GE or some of the exposed first capacitor electrode C1, whereby a short circuit may occur.

The gate insulating film GI may be formed thickly to prevent a short circuit from occurring between the active layer ACT and the gate electrode GE. That is, the gate insulating film GI may be formed with a sufficient thickness so as not to partially expose the active layer ACT.

Meanwhile, the first inter-layer insulating layer ILD1 may be formed with a sufficient thickness like the gate insulating film GI. However, if the first inter-layer insulating layer ILD1 becomes thick, a distance between the first capacitor electrode C1 and the second capacitor electrode C2 is increased, whereby capacity of the capacitor CST is reduced. In order to make sure of capacity of the capacitor CST, areas of the first capacitor electrode C1 and the second capacitor electrode C2 should be increased. However, since the non-transmissive area NTA of the transparent display panel 110 is smaller than a general display panel, there is limitation in increasing the areas of the first capacitor electrode C1 and the second capacitor electrode C2.

Consequently, since the non-transmissive area NTA of the transparent display panel 110 according to one embodiment of the present disclosure has a small area, it is beneficial to reduce or minimize the second area CSTA provided with the capacitor CST. Therefore, in the transparent display panel 110 according to one embodiment of the present disclosure, the first inter-layer insulating layer ILD1 may be formed thickly to make sure of capacity of the capacitor CST while reducing or minimizing the areas of the first capacitor electrode C1 and the second capacitor electrode C2. That is, in the transparent display panel 110 according to one embodiment of the present disclosure, the first inter-layer insulating layer ILD1 may be formed with a thickness thinner than that of the gate insulating film GI.

In the transparent display panel 110 according to one embodiment of the present disclosure, the first area DTA provided with the driving transistor DT may not be overlapped with the second area CSTA provided with the capacitor CST.

In detail, the first and second capacitor electrodes C1 and C2 of the capacitor CST may be disposed so as not to overlap the active layer ACT of the driving transistor DT as shown in FIG. 9. Particularly, the active layer ACT may not be formed between the second capacitor electrode C2 of the capacitor CST and the first substrate 111.

In the second area CSTA that is not provided with the active layer ACT, the gate insulating film GI, the first capacitor electrode C1, the first inter-layer insulating layer ILD1 and the second capacitor electrode C2 may be deposited on a flat surface. Therefore, the gate insulating film GI, the first capacitor electrode C1 and the first inter-layer insulating layer ILD1 may be deposited with a certain thickness, and the second capacitor electrode C2 may also be deposited on a flat upper surface of the first inter-layer insulating layer ILD1.

Consequently, since the first inter-layer insulating layer ILD1 is provided with a certain thickness between the first capacitor electrode C1 and the second capacitor electrode C2, a short circuit may not occur between the first capacitor electrode C1 and the second capacitor electrode C2.

Although FIGS. 7 and 9 show that the capacitor CST is not overlapped with the active layer ACT of the driving transistor DT, the present disclosure is not limited to the examples of FIGS. 7 and 9.

In the transparent display panel 110 according to one embodiment of the present disclosure, a plurality of switching transistors may further be provided in the non-transmissve area NTA. The plurality of switching transistors may include signal lines made of the same material as that of the active layer ACT on the same layer as the active layer ACT of the driving transistor DT. In this case, the capacitor CST may be disposed so as not to overlap the signal lines made of the same material as that of the active layer ACT of the driving transistor DT on the same layer as the active layer ACT. Similarly, in some embodiments, the plurality of switching transistors may include signal lines including the same material as that of the active layer ACT. Here, the signal lines may be on the same layer as the active layer ACT of the driving transistor DT. Also, in this case, the capacitor CST may not overlap the signal lines that includes the same material as that of the active layer ACT of the driving transistor DT.

Meanwhile, in the transparent display panel 110 according to one embodiment of the present disclosure, the anode auxiliary electrode 115 may further be provided between the drain electrode DE and the anode electrode 120. The drain electrode DE, as shown in FIG. 10, may electrically be connected with the anode electrode 120 through the anode auxiliary electrode 115. The anode electrode 120 may be connected to the anode auxiliary electrode 115 through the third contact hole CH3 that passes through the second planarization film PLN2, and the anode auxiliary electrode 115 may be connected to the drain electrode DE through the second contact hole CH2 that passes through the first planarization film PLN1. The drain electrode DE may be connected to the active layer ACT through the first contact hole CH1 that passes through the gate insulating film GI, the first inter-layer insulating layer ILD1 and the second planarization film PLN2.

In the transparent display panel 110 according to one embodiment of the present disclosure, the anode auxiliary electrode 115 and the second planarization film PLN2 are further provided, whereby a degree of freedom in a design of a circuit for connecting the anode electrode 120 with the drain electrode DE may be increased. In the transparent display panel 110 according to one embodiment of the present disclosure, the third contact hole CH3 for connecting the anode auxiliary electrode 115 with the anode electrode 120 may be designed at a position different from the first contact hole CH1 for connecting the active layer ACT with the drain electrode DE and the second contact hole CH2 for connecting the drain electrode DE with the anode auxiliary electrode 115.

In detail, in the transparent display panel 110 according to one embodiment of the present disclosure, the first contact hole CH1 and the second contact hole CH2 may be disposed to be spaced apart from the second area CSTA. As a result, in the transparent display panel 110 according to one embodiment of the present disclosure, the active layer ACT may not be overlapped with the capacitor CST.

Also, in the transparent display panel 110 according to one embodiment of the present disclosure, the third contact hole CH3 that passes through the second planarization film PLN2 may be disposed in the second area CSTA. The first capacitor electrode C1 and the second capacitor electrode C2 are provided in the second area CSTA. Here, the second capacitor electrode C2 may be deposited on the flat surface at a certain thickness as described above. Therefore, the second capacitor electrode C2 may provide a flat surface.

In the transparent display panel 110 according to one embodiment of the present disclosure, the anode auxiliary electrode 115 provided over the second capacitor electrode C2 may have a flat upper surface. Therefore, in the transparent display panel 110 according to one embodiment of the present disclosure, the third contact hole CH3 may be formed on the flat upper surface of the second capacitor electrode C2, whereby flatness of the third contact hole CH3 may be obtained. Also, in the transparent display panel 110 according to one embodiment of the present disclosure, the third contact hole CH3 may accurately be formed without damage of the anode auxiliary electrode 115. Therefore, in the transparent display panel 110 according to one embodiment of the present disclosure, the anode electrode 120 and the drain electrode DE may stably in contact with each other.

In some embodiments, the first inter-layer insulating layer ILD1 and the second inter-layer insulating layer ILD2 may be provided in the non-transmissive area NTA, and may not be provided in the transmissive area TA. Each of the first inter-layer insulating layer ILD1 and the second inter-layer insulating layer ILD2 may be made of an inorganic film such as a silicon nitride (SiNx) film having a refractive index of 1.8 to 1.9. If a high refractive film such as SiNx is formed in the transmissive area TA, externally incident light may be reflected from the high refractive film, whereby light loss may occur. As a result, transmittance of the transparent display panel 110 may be reduced in the transmissive area TA. In some embodiments, the first inter-layer insulating layer ILD1 and the second inter-layer insulating layer ILD2 includes an inorganic film having a refractive index of 1.8 to 1.9.

The transparent display panel 110 according to one embodiment of the present disclosure may remove high refractive films from the transmissive area TA to improve transmittance in the transmissive area TA.

For example, the first inter-layer insulating layer ILD1 and the second inter-layer insulating layer ILD2 may be formed of silicon nitride (SiNx) films. In this case, the first inter-layer insulating layer ILD1 and the second inter-layer insulating layer ILD2 may be provided in only the non-transmissive area NTA, and may not be provided in the transmissive area TA.

The transparent display panel 110 according to one embodiment of the present disclosure may prevent external light from being lost in the transmissive area TA, whereby transmittance in the transmissive area TA may be improved.

In some embodiments, the bank 125 may be provided in only the non-transmissive area NTA, and may not be provided in the transmissive area TA. The bank 125 may have a yellowish color due to its material characteristic. In the transparent display panel 110 according to one embodiment of the present disclosure, as the bank 125 is not formed in the transmissive area TA, a yellowish phenomenon may be prevented from occurring in the transmissive area TA.

Meanwhile, the bank 125 may have an end different from ends of the first inter-layer insulating layer ILD1 and the second inter-layer insulating layer ILD2 provided between the anode electrode 120 and the first substrate 111.

A distance d2 between the transmissive area TA and the end of the bank 125 may be longer than a distance d1 between the transmissive area TA and the ends of the first inter-layer insulating layer ILD1 and the second inter-layer insulating layer ILD2. That is, the ends of the first inter-layer insulating layer ILD1 and the second inter-layer insulating layer ILD2 may be formed to be closer to the transmissive area TA than the end of the bank 125.

The bank 125 may partially be overlapped with the transmissive area TA due to a process error. Since the bank 125 has a yellowish color, the transparent display panel 110 may have a yellowish color in the transmissive area TA where the bank 125 is provided, and a user may recognize this.

In the transparent display panel 110 according to one embodiment of the present disclosure, even though a process error occurs, the distance d2 between the transmissive area TA and the end of the bank 125 may be formed sufficiently such that the bank 125 may not be overlapped with the transmissive area TA.

Meanwhile, at least one insulating film provided between the anode electrode 120 and the first substrate 111 may have a sufficient area to protect the circuit elements provided in the non-transmissive area NTA, for example, the driving transistor DT. The first inter-layer insulating layer ILD1 and the second inter-layer insulating layer ILD2 may be formed to cover the area where the circuit elements are formed. Moreover, the first inter-layer insulating layer ILD1 and the second inter-layer insulating layer ILD2 may be formed at a position where their ends are spaced apart from the area where the driving transistor DT is formed, at a sufficient distance, to improve reliability of the circuit elements. Therefore, the distance d1 between the transmissive area TA and the ends of the first inter-layer insulating layer ILD1 and the second inter-layer insulating layer ILD2 may be shorter than the distance d2 between the transmissive area TA and the end of the bank 125.

Referring to FIG. 2 again, the non-display area NDA may be provided with a pad area PA in which pads PAD are disposed, and at least one gate driver 205.

In detail, the non-display area NDA may include a first non-display area NDA1 in which the pads PAD are disposed, a second non-display area NDA2 disposed in parallel with the first non-display area NDA1 by interposing the display area DA, and third and fourth non-display areas NDA3 and NDA4 connecting the first non-display area NDA1 with the second non-display area NDA2.

The gate driver 205 is connected to the gate lines GL and supplies gate signals to the gate lines GL. The gate driver 205 may be disposed in at least one of the fourth non-display area NDA4 and the third non-display area NDA3 in a gate drive in panel (GIP) type. For example, as shown in FIG. 2, the gate driver 205 may be formed in the fourth non-display area NDA4, and another gate driver 205 may be formed in the third non-display area NDA3, but is not limited thereto. The gate driver 205 may be formed in any one of the fourth non-display area NDA4 and the third non-display area NDA3.

The pads PAD may include a first pad VDDP, a second pad VSSP, a third pad VREFP, and a fourth pad DP, and may be provided in the first non-display area NDA1. That is, the first non-display area NDA1 may include a pad area PA.

The transparent display panel 110 according to one embodiment of the present disclosure may include a plurality of signal lines connected with the subpixels P1, P2 and P3 provided in the display area DA. For example, the transparent display panel 110 according to one embodiment of the present disclosure may include a pixel power line VDD, a common power line VSS and a reference line VREF.

The pixel power line VDD may supply a first power source to the driving transistor DT of each of the subpixels P1, P2 and P3 provided in the display area DA.

Accordingly, in some embodiments, the pixel power line VDD may include a first pixel power line VDD1 provided in a first non-display area NDA1, a second pixel power line VDD2 provided in a second non-display area NDA2, and a plurality of third pixel power lines VDDL connecting the first pixel power line VDD1 with the second pixel power line VDD2.

The common power line VSS may supply a second power source to the cathode electrode 140 of the subpixels P1, P2 and P3 provided in the display area DA. Here, the second power source may be a common power source commonly supplied to the subpixels P1, P2 and P3.

Accordingly, in some embodiments, the common power line VSS may include a first common power line VSS1 provided in the first non-display area NDA1, a second common power line VSS2 provided in the second non-display area NDA2, and a plurality of third common power lines VSSL connecting the first common power line VSS1 with the second common power line VSS2.

The reference line VREF may supply an initialization voltage (or sensing voltage) to the driving transistor DT of each of the subpixels P1, P2 and P3 provided in the display area DA.

Accordingly, in some embodiments, the reference line VREF may include a first reference line VREF1 provided in the first non-display area NDA1, and a plurality of second reference lines VREFL disposed in the display area DA.

Hereinafter, the first pixel power line VDD1, the first common power line VSS1 and the first reference line VREF1, which are provided in a first non-display area NDA1, will be described in more detail with reference to FIGS. 11 to 13.

Figure 11:
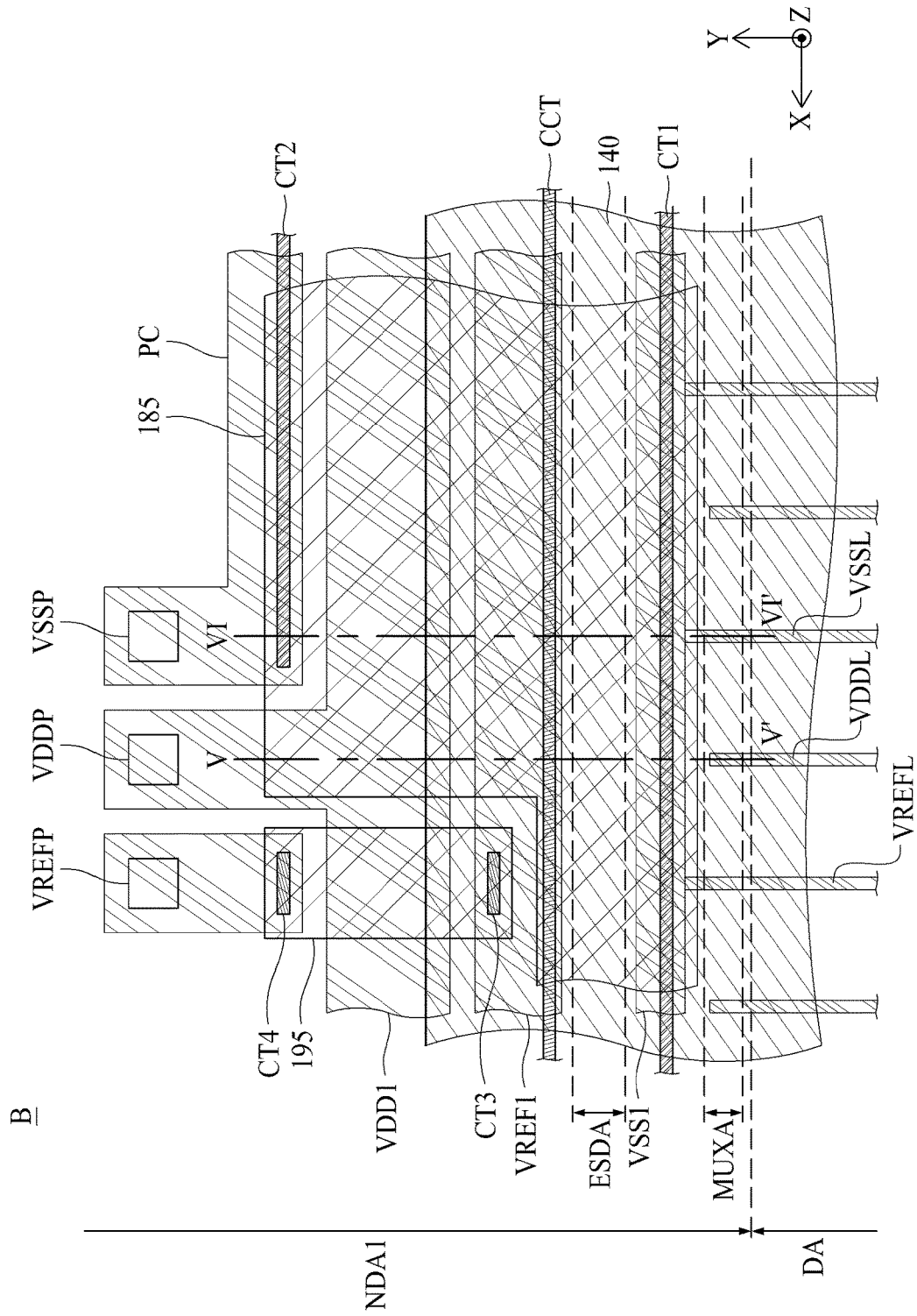
FIG. 11 is an enlarged view of an area B in FIG. 2.
Figure 12:
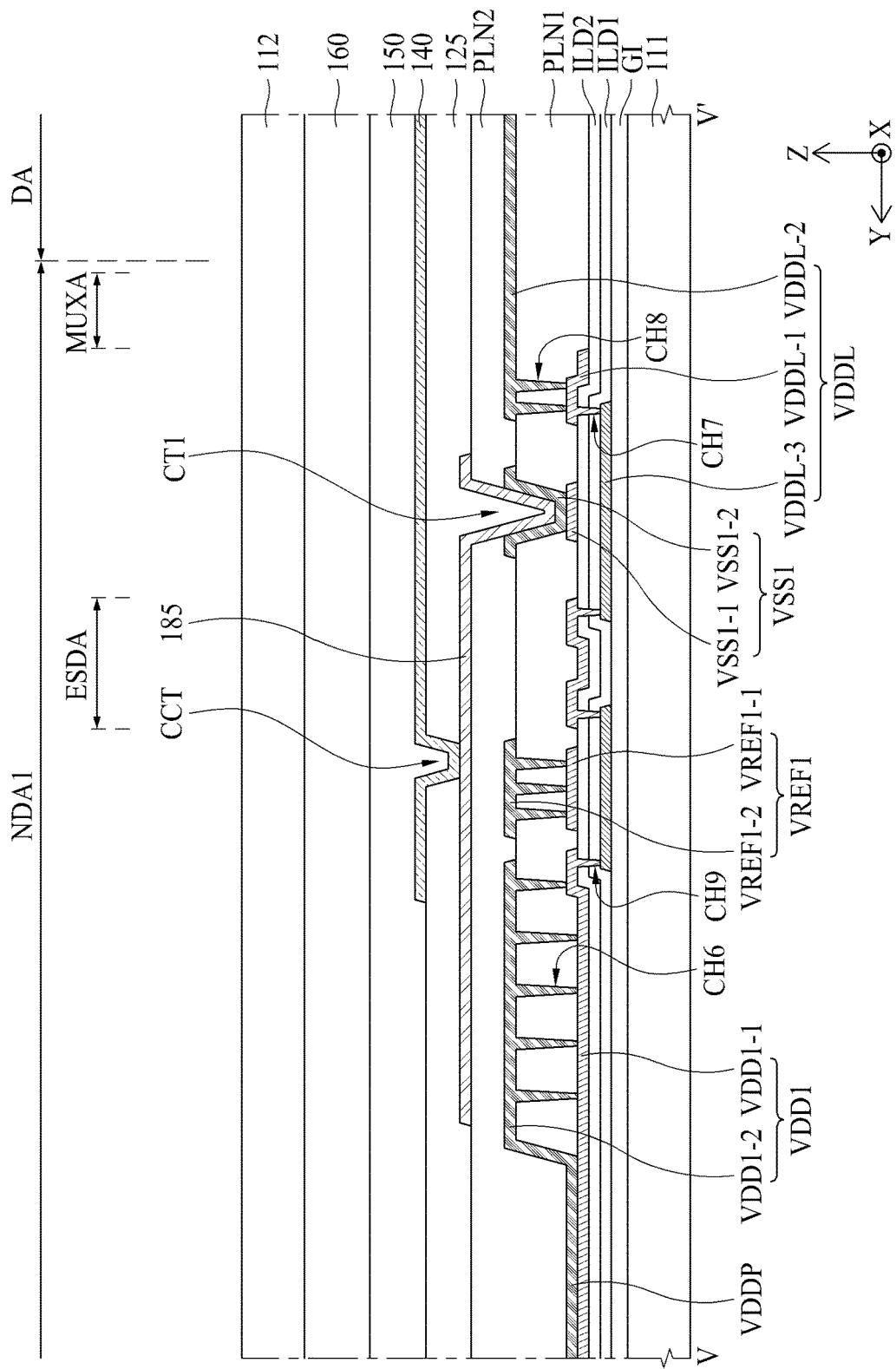
FIG. 12 is a cross-sectional view taken along line V-V' of FIG. 11.
Figure 13:
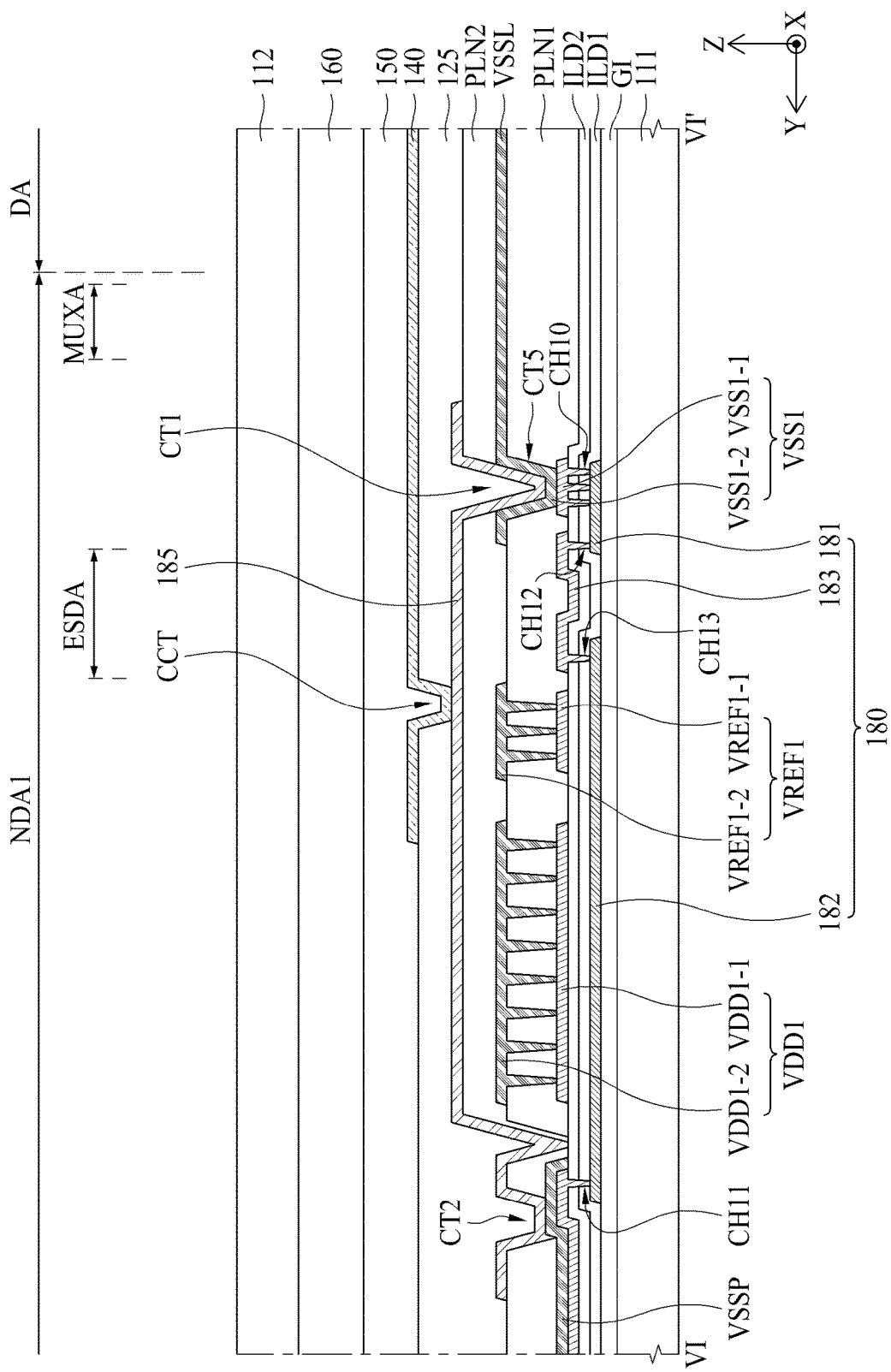
FIG. 13 is a cross-sectional view taken along line VI-VI' of FIG. 11.

FIG. 11 is an enlarged view of an area B in FIG. 2, FIG. 12 is a cross-sectional view taken along line V-V' of FIG. 11, FIG. 13 is a cross-sectional view taken along line VI-VI' of FIG. 11.

The pads PAD, a first pixel power line VDD1, a first common power line VSS1, a first reference line VREF1, a third pixel power line VDDL and a third common power line VSSL are provided in the first non-display area NDA1.

Referring to FIGS. 2, 11 and 12, the first pixel power line VDD1 may be provided to be extended in the first non-display area NDA1, specifically between the pad area PA and the display area DA in a first direction (X axis direction). The first pixel power line VDD1 may be connected with the first pad VDDP in the first non-display area NDA1, and may be supplied with a first power source from the first pad VDDP. The first pad VDDP may be extended in a second direction (Y axis direction), and may be connected with the first pixel power line VDD1. For example, the first pixel power line VDD1 and the first pad VDDP may be provided in the same layer as shown in FIG. 12, and may be connected with each other without being spaced apart from each other.

Also, the first pixel power line VDD1 may be connected with a plurality of third pixel power lines VDDL disposed in the display area DA, and may supply the first power source to the driving transistor DT of each of the subpixels P1, P2 and P3 through the plurality of third pixel power lines VDDL.

The first pixel power line VDD1 may be made of a plurality of metal layers. For example, the first pixel power line VDD1, as shown in FIG. 12, may include a first metal layer VDD1-1 and a second metal layer VDD1-2 provided over the first metal layer VDD1-1. The first metal layer VDD1-1 and the second metal layer VDD1-2 may partially be overlapped with each other, and may be connected with each other through a sixth contact hole CH6.

Here, the first metal layer VDD1-1 of the first pixel power line VDD1 may be provided in the same layer as the source electrode SE and the drain electrode DE of the driving transistor DT provided in the display area DA. The first metal layer VDD1-1 may be made of the same material as that of the source electrode SE and the drain electrode DE of the driving transistor DT and may be formed simultaneously with them.

The second metal layer VDD1-2 of the first pixel power line VDD1 may be provided in the same layer as the anode auxiliary electrode 115 provided in the display area DA. The second metal layer VDD1-2 may be made of the same material as that of the anode auxiliary electrode 115 and may be formed simultaneously with the anode auxiliary electrode 115. In this case, the second metal layer VDD1-2 of the first pixel power line VDD1 may be connected to the first metal layer VDD1-1 through a plurality of sixth contact holes CH6 that pass through the first planarization layer PLN1.

In the transparent display panel 110 according to one embodiment of the present disclosure, as the first pixel power line VDD1 provided in the non-display area NDA is provided as a double layer, a total area of the first pixel power line VDD1 may be increased, whereby resistance of the first pixel power line VDD1 may be reduced.

Also, in the transparent display panel 110 according to one embodiment of the present disclosure, as the second metal layer VDD1-2 of the first pixel power line VDD1 may be connected to the first metal layer VDD1-1 through the plurality of sixth contact holes CH6, the first metal layer VDD1-1 and the second metal layer VDD1-2 may stably be connected with each other.

The third pixel power line VDDL may be provided between the transmissive areas TA in the display area DA, and thus may be connected with the driving transistor DT of each of the subpixels P1, P2 and P3. The third pixel power line VDDL may be extended in the display area DA in a second direction (Y axis direction), and thus its one end may be connected with the first pixel power line VDD1.

Here, the third pixel power line VDDL may be connected with the first pixel power line VDD1 as one layer but may be connected with the first pixel power line VDD1 as a plurality of layers as shown in FIG. 12.

For example, the third pixel power line VDDL may include a second metal layer VDDL-2 and a third metal layer VDDL-3 provided below the second metal layer VDDL-2. The second metal layer VDDL-2 of the third pixel power line VDDL may be extended in the display area DA to the first non-display area NDA1 in a second direction (Y axis direction). The second metal layer VDDL-2 may be provided in the same layer as the anode auxiliary electrode 115 provided in the display area DA. The second metal layer VDDL-2 may be made of the same material as that of the anode auxiliary electrode 115 and may be formed simultaneously with the anode auxiliary electrode 115.

One end of the third metal layer VDDL-3 of the third pixel power line VDDL may be connected to the second metal layer VDDL-2 of the third pixel power line VDDL in the first non-display area NDA1, and the other end thereof may be connected to the first pixel power line VDD1. The third metal layer VDDL-3 may be provided in the same layer as the gate electrode GE of the driving transistor DT provided in the display area DA. The third metal layer VDDL-3 may be made of the same material as that of the gate electrode GE of the driving transistor DT and may be formed simultaneously with the gate electrode GE.

The third metal layer VDDL-3 of the third pixel power line VDDL may be connected to the second metal layer VDDL-2 of the third pixel power line VDDL at one end through the first metal layer VDDL-1. In this case, the third metal layer VDDL-3 of the third pixel power line VDDL may be connected to the first metal layer VDDL-1 through a seventh contact hole CH7 that passes through the first and second inter-layer insulating layers ILD1 and ILD2. The first metal layer VDDL-1 may be connected to the second metal layer VDDL-2 of the third pixel power line VDDL through a seventh contact hole CH7 that passes through the first planarization layer PLN1. Therefore, the third metal layer VDDL-3 of the third pixel power line VDDL may electrically be connected with the second metal layer VDDL-2 of the third pixel power line VDDL.

Also, the third metal layer VDDL-3 of the third pixel power line VDDL may be connected to the first metal layer VDD1-1 of the first pixel power line VDD1 at the other end through a ninth contact hole CH9 that passes through the first and second inter-layer insulating layers ILD1 and ILD2.

Referring to FIGS. 2, 11 and 13, the first common power line VSS1 may be provided to be extended in the first non-display area NDA1, specifically between the first pixel power line VDD1 and the display area DA in a first direction (X axis direction). The first common power line VSS1 may be connected with the second pad VSSP in the first non-display area NDA1, and may be supplied with a second power source from the second pad VSSP. Also, the first common power line VSS1 may be connected with the plurality of third common power lines VSSL disposed in the display area DA, and may supply the second power source to the cathode electrode 140 of the subpixels P1, P2 and P3 through the plurality of third common power lines VSSL.

The first common power line VSS1 may be made of a plurality of metal layers. For example, the first common power line VSS1, as shown in FIG. 13, may include a first metal layer VSS1-1 and a second metal layer VSS1-2 provided over the first metal layer VSS1-1. The first metal layer VSS1-1 and the second metal layer VSS1-2 may partially be overlapped with each other, and may be connected with each other through a fifth contact part CT5.

Here, the first metal layer VSS1-1 of the first power line VSS1 may be provided in the same layer as the source electrode SE and the drain electrode DE of the driving transistor DT provided in the display area DA. The first metal layer VSS1-1 may be made of the same material as that of the source electrode SE and the drain electrode DE of the driving transistor DT and may be formed simultaneously with them.

The second metal layer VSS1-2 of the first common power line VSS1 may be provided in the same layer as the anode auxiliary electrode 115 provided in the display area DA. The second metal layer VSS1-2 may be made of the same material as that of the anode auxiliary electrode 115 and may be formed simultaneously with the anode auxiliary electrode 115.

In this case, the second metal layer VSS1-2 of the first common power line VSS1 may be connected to the first metal layer VSS1-1 through the fifth contact part CT5 that passes through the first planarization layer PLN1. The fifth contact part CT5 may partially remove the first planarization layer PLN1 and partially expose the upper surface of the first metal layer VSS1-1 of the first common power line VSS1. Here, the fifth contact part CT5 may expose the upper surface of the first metal layer VSS1-1 of the first common power line VSS1 along the first direction (X axis direction). The second metal layer VSS1-2 of the first common power line VSS1 may directly in contact with the exposed upper surface of the first metal layer VSS1-1 of the first common power line VSS1. As a result, the second metal layer VSS1-2 of the first common power line VSS1 may have a wide contact area with the first metal layer VSS1-1 of the first common power line VSS1, thereby being stably connected to the first metal layer VSS1-1.

In the transparent display panel 110 according to one embodiment of the present disclosure, as the first common power line VSS1 provided in the first non-display area NDA1 is provided as a double layer, a total area of the first common power line VSS1 may be increased, whereby resistance of the first common power line VSS1 may be reduced.

Meanwhile, the first common power line VSS1 may electrically be connected with the second pad VSSP provided in the pad area PA. Here, the first pixel power line VDD1 and the first reference line VREF1 may be provided between the first common power line VSS1 and the second pad VSSP. If the first common power line VSS1 is formed in the same layer as the first pixel power line VDD1 and the first reference line VREF1, the first common power line VSS1 and the second pad VSSP cannot be formed in the same layer in a single body.

The transparent display panel 110 according to one embodiment of the present disclosure may electrically connect the first common power line VSS1 with the second pad VSSP by using a plurality of connection electrodes disposed on different layers.

In detail, the transparent display panel 110 according to one embodiment of the present disclosure may electrically connect the first common power line VSS1 with the second pad VSSP by using a first common power connection electrode 180 and a second common power connection electrode 185, which are disposed on their respective layers different from each other.

The first common power connection electrode 180 is provided in the first non-display area NDA1. The first common power connection electrode 180 is provided between the first common power line VSS1 and the first substrate 111, and electrically connects the first common power line VSS1 with the second pad VSSP.

For example, the first common power connection electrode 180 may be provided in the same layer as the gate electrode GE of the driving transistor DT provided in the display area DA. Also, the first common power connection electrode 180 may be made of the same material as that of the gate electrode GE of the driving transistor DT and may be formed simultaneously with the gate electrode GE.

One end of the first common power connection electrode 180 may be connected to the first common power line VSS1 and the other end of the first common power connection electrode 180 may be connected to the second pad VSSP. In detail, the first common power connection electrode 180 may be connected to the first metal layer VSS1-1 of the first common power line VSS1 at one end through an tenth contact hole CH10 that passes through the first and second inter-layer insulating layers ILD1 and ILD2. Also, the first common power connection electrode 180 may be connected to the second pad VSSP at the other end through a eleventh contact hole CH11 that passes through the first and second inter-layer insulating layers ILD1 and ILD2.

Meanwhile, the first common power connection electrode 180 may be formed between the second pad VSSP and the first common power line VSS1 as one electrode but is not limited thereto. The first common power connection electrode 180 may include a plurality of electrodes.

For example, the first common power connection electrode 180, as shown in FIG. 13, may include one first common power connection electrode 181, another first common power connection electrode 182, and other first common power connection electrode 183.

One first common power connection electrode 181 may be connected to the first common power line VSS1 through the tenth contact hole CH10, and another first common power connection electrode 182 may be connected to the second pad VSSP through the eleventh contact hole CH11. One first common power connection electrode 181 and another first common power connection electrode 182 may be provided in the same layer as the gate electrode GE of the driving transistor DT.

One end of the other first common power connection electrode 183 provided over a layer different from one first common power connection electrode 181 and another first common power connection electrode 182 may be connected to the first common power connection electrode 181 through a twelfth contact hole CH12, and the other end thereof may be connected to the first common power connection electrode 182 through an thirteenth contact hole CH13. Here, the other first common power connection electrode 183 may be provided in the same layer as the source electrode SE and the drain electrode DE of the driving transistor DT.

The second common power connection electrode 185 may be provided in the first non-display area NDA1, and may partially be overlapped with the first common power connection electrode 180. Also, the second common power connection electrode 185 is provided over the first common power line VSS1, and electrically connects the first common power line VSS1 with the second pad VSSP.

For example, the second common power connection electrode 185 may be provided in the same layer as the anode electrode 120 of the light emitting diode provided in the display area DA. Also, the second common power connection electrode 185 may be made of the same material as that of the anode electrode 120 of the light emitting diode and may be formed simultaneously with the anode electrode 120.

One end of the second common power connection electrode 185 may be connected to the first common power line VSS1, and the other end of the second common power connection electrode 185 may be connected to the second pad VSSP. In detail, the second common power connection electrode 185 may be connected to the second metal layer VSS1-2 of the first common power line VSS1 at one end through a first contact part CT1. The first contact part CT1 may partially remove the second planarization layer PLN2 and partially expose the upper surface of the second metal layer VSS1-2 of the first common power line VSS1. Here, the first contact part CT1 may expose the upper surface of the second metal layer VSS1-2 of the first common power line VSS1 along the first direction (X axis direction). The second common power connection electrode 185 may directly in contact with the exposed upper surface of the first common power line VS S1. As a result, the second common power connection electrode 185 may have a wide contact area with the first common power line VSS1, thereby being stably connected to the first common power line VSS1. Meanwhile, at least a part of the first contact part CT1 may be formed to overlap the fifth contact part CT5.

The second common power connection electrode 185 may be connected to the second pad VSSP at the other end through a second contact part CT2. The second contact part CT2 may partially remove the first planarization layer PLN1 and partially expose the upper surface of the second pad VSSP. The second pad VSSP, as shown in FIG. 2, may include a plurality of pad parts. Here, two pad parts disposed to adjoin each other may be connected with each other through a pad connection electrode PC. The second contact part CT2 may expose the upper surface of the second pad VSSP connected by the pad connection electrode PC along the first direction (X axis direction). The second common power connection electrode 185 may directly in contact with the exposed upper surface of the second pad VSSP. As a result, the second common power connection electrode 185 may have a wide contact area with the second pad VSSP, thereby being stably connected to the second pad VSSP.

Also, the second common power connection electrode 185 may electrically be connected with the cathode electrode 140 through a cathode contact part CCT in the first non-display area NDA1. The cathode contact part CCT may partially remove the bank 125 and partially expose the upper surface of the second common power connection electrode 185. The cathode contact part CCT may expose the upper surface of the second common power connection electrode 185 along the first direction (X axis direction). As a result, the second common power connection electrode 185 may have a wide contact area with the cathode electrode 140, thereby being stably connected to the cathode electrode 140.

Consequently, the first common power line VSS1 may electrically be connected with the cathode electrode 140 through the second common power connection electrode 185. Therefore, the first common power line VSS1 may supply the second power source forwarded from the second pad VSSP to the cathode electrode 140.

The transparent display panel 110 according to one embodiment of the present disclosure may electrically connect the first common power line VSS1 and the second pad VSSP, which are disposed in the first non-display area NDA1, with each other by using the first common power connection electrode 180 and the second common power connection electrode 185 disposed on their respective layers different from each other. Here, the first common power connection electrode 180 may be provided below the first common power line VSS1 and the second pad VSSP, and the second common power connection electrode 185 may be provided over the first common power line VSS1 and the second pad VSSP.

Therefore, the transparent display panel 110 according to one embodiment of the present disclosure may increase a total area of the common power line VSS, whereby resistance of the common power line VSS may be reduced.

Also, in the transparent display panel 110 according to one embodiment of the present disclosure, even though a defect occurs in any one of the first common power connection electrode 180 and the second common power connection electrode 185, the first common power line VSS1 and the second pad VSSP may be connected with each other by the other one. Therefore, since the transparent display panel 110 according to one embodiment of the present disclosure may stably supply the first power source to the subpixels P1, P2 and P3, panel yield may be improved.

The third common power line VS SL is provided between the transmissive areas TA in the display area DA. Here, the transparent display panel 110 according to one embodiment of the present disclosure may reduce or minimize the non-transmissive area NTA in the display area DA by alternately disposing the third common power line VSSL and the third pixel power line VDDL between the transmissive areas TA. Therefore, the transparent display panel 110 according to one embodiment of the present disclosure may enhance transmittance by increasing the transmissive area TA.

Meanwhile, the third common power line VS SL may be extended in the display area DA in a second direction (Y axis direction), and thus its one end may be connected with the first common power line VSS1 and its other end may be connected with the second common power line VS S2. For example, the third common power line VS SL and the first common power line VSS1, as shown in FIG. 13, may be provided in the same layer, and may be connected with each other without being spaced apart from each other.

Referring to FIGS. 2 and 11, the first reference line VREF1 may be provided to be extended in the first non-display area NDA1, specifically between the first pixel power line VDD1 and the first common power line VSS1 in a first direction (X axis direction). The first reference line VREF1 may be connected with the third pad VREFP in the first non-display area NDA1, and may be supplied with the initialization voltage (or sensing voltage) from the third pad VREFP. Also, the first reference line VREF1 may be connected with the plurality of second reference lines VREFL disposed in the display area DA, and may supply the initialization voltage (or sensing voltage) to the transistor DT of each of the subpixels P1, P2 and P3 through the plurality of second reference lines VREFL.

The first reference line VREF1 may electrically be connected with the third pad VREFP provided in the pad area PA. Here, the first pixel power line VDD1 may be provided between the first reference line VREF1 and the third pad VREFP. If the first reference line VREF1 is formed in the same layer as the first pixel power line VDD1, the first reference line VREF1 and the third pad VREFP cannot be formed in the same layer in a single body.

The transparent display panel 110 according to one embodiment of the present disclosure may electrically connect the first reference line VREF1 with the third pad VREFP by using a plurality of connection electrodes disposed over different layers.

In detail, the transparent display panel 110 according to one embodiment of the present disclosure may electrically connect the first reference line VREF1 with the third pad VREFP by using a first reference connection electrode (not shown) and a second reference connection electrode 195, which are disposed on their respective layers different from each other.

The first reference connection electrode (not shown) is provided in the first non-display area NDA1. The first reference connection electrode (not shown) is provided between the first reference line VREF1 and the first substrate 111, and electrically connects the first reference line VREF1 with the third pad VREFP.

For example, the first reference connection electrode (not shown) may be provided in the same layer as the gate electrode GE of the driving transistor DT provided in the display area DA. Also, the first reference connection electrode (not shown) may be made of the same material as that of the gate electrode GE of the driving transistor DT and may be formed simultaneously with the gate electrode GE.

The second reference connection electrode 195 may be provided in the first non-display area NDA1. At least a part of the second reference connection electrode 195 may be overlapped with the first reference connection electrode (not shown). The second reference connection electrode 195 is provided over the first reference line VREF1, and electrically connects the first reference line VREF1 with the third pad VREFP.

For example, the second reference connection electrode 195 may be provided in the same layer as the anode electrode 120 of the light emitting diode provided in the display area DA. Also, the second reference connection electrode 195 may be made of the same material as that of the anode electrode 120 of the light emitting diode and may be formed simultaneously with the anode electrode 120.

One end of the second reference connection electrode 195 may be connected to the first reference line VREF1 and the other end thereof may be connected to the third pad VREFP. In detail, the second reference connection electrode 195 may be connected to the first reference line VREF1 at one end through a third contact part CT3. The second reference connection electrode 195 may be connected to the third pad VREFP at the other end through a fourth contact part CT4.

The second reference connection electrode 195 is formed in the same layer as the second common power connection electrode 185 but is spaced apart from the second common power connection electrode 185. Therefore, the second reference connection electrode 195 is not electrically connected with the second common power connection electrode 185.

The transparent display panel 110 according to one embodiment of the present disclosure may connect the first reference line VREF1 and the third pad VREFP, which are disposed in the first non-display area NDA1, with each other by using the first reference connection electrode (not shown) and the second reference connection electrode 195 disposed on their respective layers different from each other. Here, the first reference connection electrode (not shown) may be provided below the first reference line VREF1 and the third pad VREFP, and the second reference connection electrode 195 may be provided over the first reference line VREF1 and the third pad VREFP.

Therefore, the transparent display panel 110 according to one embodiment of the present disclosure may increase a total area of the first reference line VREF1, whereby resistance of the first reference line VREF1 may be reduced.

Also, in the transparent display panel 110 according to one embodiment of the present disclosure, even though a defect occurs in any one of the first reference connection electrode (not shown) and the second reference connection electrode 195, the first reference line VREF1 and the third pad VREFP may be connected with each other by the other one. Therefore, since the transparent display panel 110 according to one embodiment of the present disclosure may stably supply the initialization voltage (or sensing voltage) to the subpixels P1, P2 and P3, panel yield may be improved.

Also, the transparent display panel 110 according to one embodiment of the present disclosure may test a defect of the driving transistor DT before the anode electrode 120 is deposited.

In some embodiments, the transparent display panel 110 may connect the first common power line VSS1 with the second pad VSSP by using only the second common power connection electrode 185 provided in the same layer as the anode electrode 120. Also, in some embodiments, the transparent display panel 110 may connect the first reference line VREF1 with the third pad VREFP by using only the second reference connection electrode 195 provided in the same layer as the anode electrode 120.

In this case, a process of testing a defect of the driving transistor DT has no choice but to be performed after the anode electrode 120 is deposited. If a defect occurs in the driving transistor DT, a repair process may be performed to repair a portion where the defect has occurred. Here, the layers deposited on the layer where the defect has occurred should be removed to perform the repair process. For example, if the defect occurs in the layer provided with the anode auxiliary electrode 115, the second planarization layer PLN2 and the anode electrode 120 should be removed for the repair process. Here, luminescence may not be performed in the corresponding area.

In this way, if the repair process is performed after the anode electrode 120 is formed, repair yield is reduced due to the anode electrode 120 and the second planarization layer PLN2 provided over the anode auxiliary electrode 115, and a tact time is increased.

The transparent display panel 110 according to one embodiment of the present disclosure may connect the first common power line VSS1 with the second pad VSSP by using the first common power connection electrode 180 and the second common power connection electrode 185. Also, the transparent display panel 110 according to one embodiment of the present disclosure may connect the first common power line VS S1 with the second pad VSSP through the first common power connection electrode 180 even though the second common power connection electrode 185 is not formed.

The transparent display panel 110 according to one embodiment of the present disclosure may connect the first reference line VREF1 with the third pad VREFP by using the first reference connection electrode (not shown) and the second reference connection electrode 195. Also, the transparent display panel 110 according to one embodiment of the present disclosure may connect the first reference line VREF1 with the third pad VREFP through the first reference connection electrode 190 even though the second reference connection electrode 195 is not formed.

Therefore, the transparent display panel 110 according to one embodiment of the present disclosure may test a defect of the driving transistor DT before the anode electrode 120 is deposited. That is, since the repair process is performed before the second planarization layer PLN2 and the anode electrode 120 are deposited, the transparent display panel 110 according to one embodiment of the present disclosure may prevent repair yield from being reduced due to the second planarization layer PLN2 and the anode electrode 120. In addition, the transparent display panel 110 according to one embodiment of the present disclosure may reduce a tact time.

Hereinafter, the second pixel power line VDD2 and the second common power line VSS2 provided in the second non-display area NDA2 will be described in more detail with reference to FIGS. 14 to 16.

Figure 14:
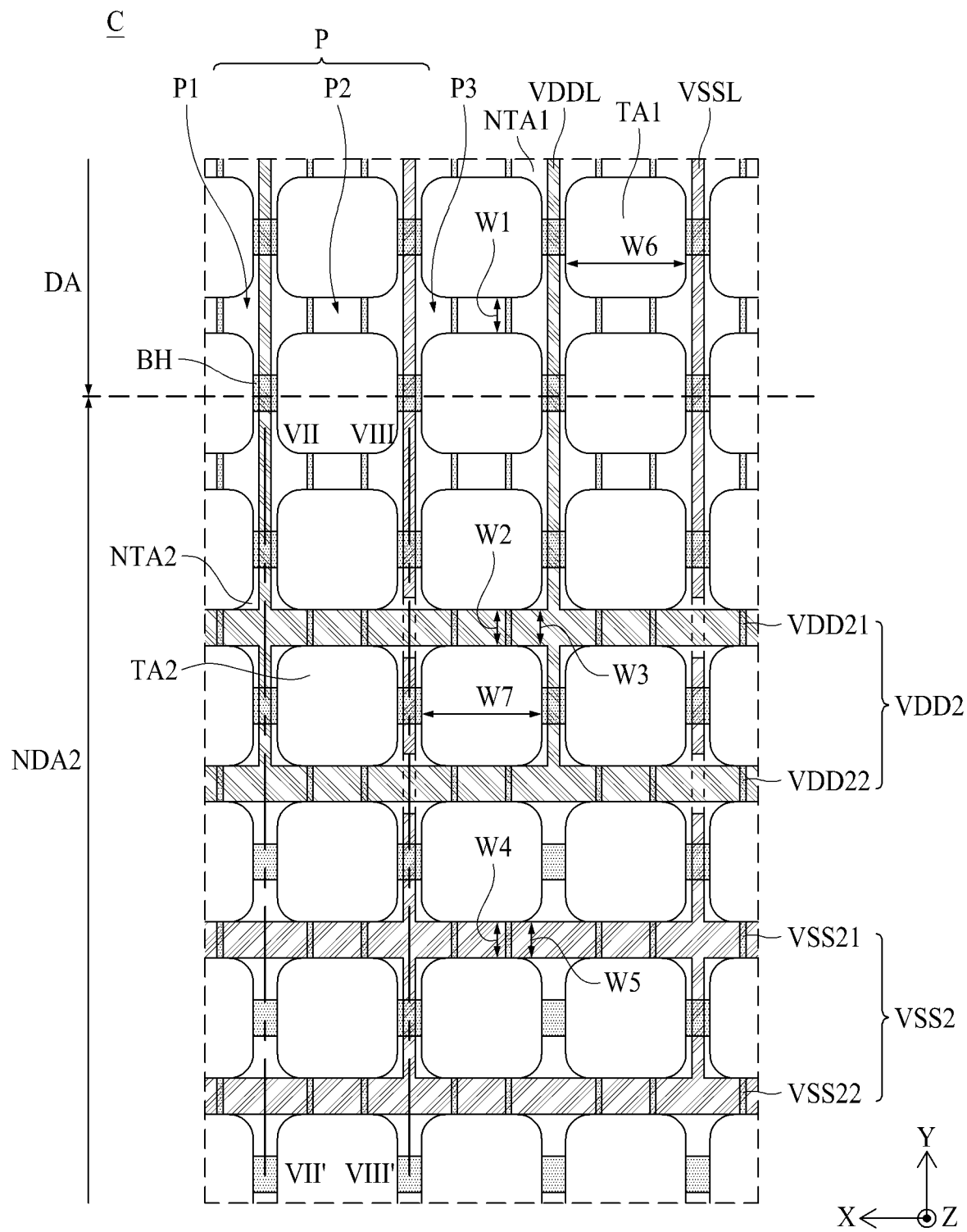
FIG. 14 is an enlarged view of an area C in FIG. 2.
Figure 15:
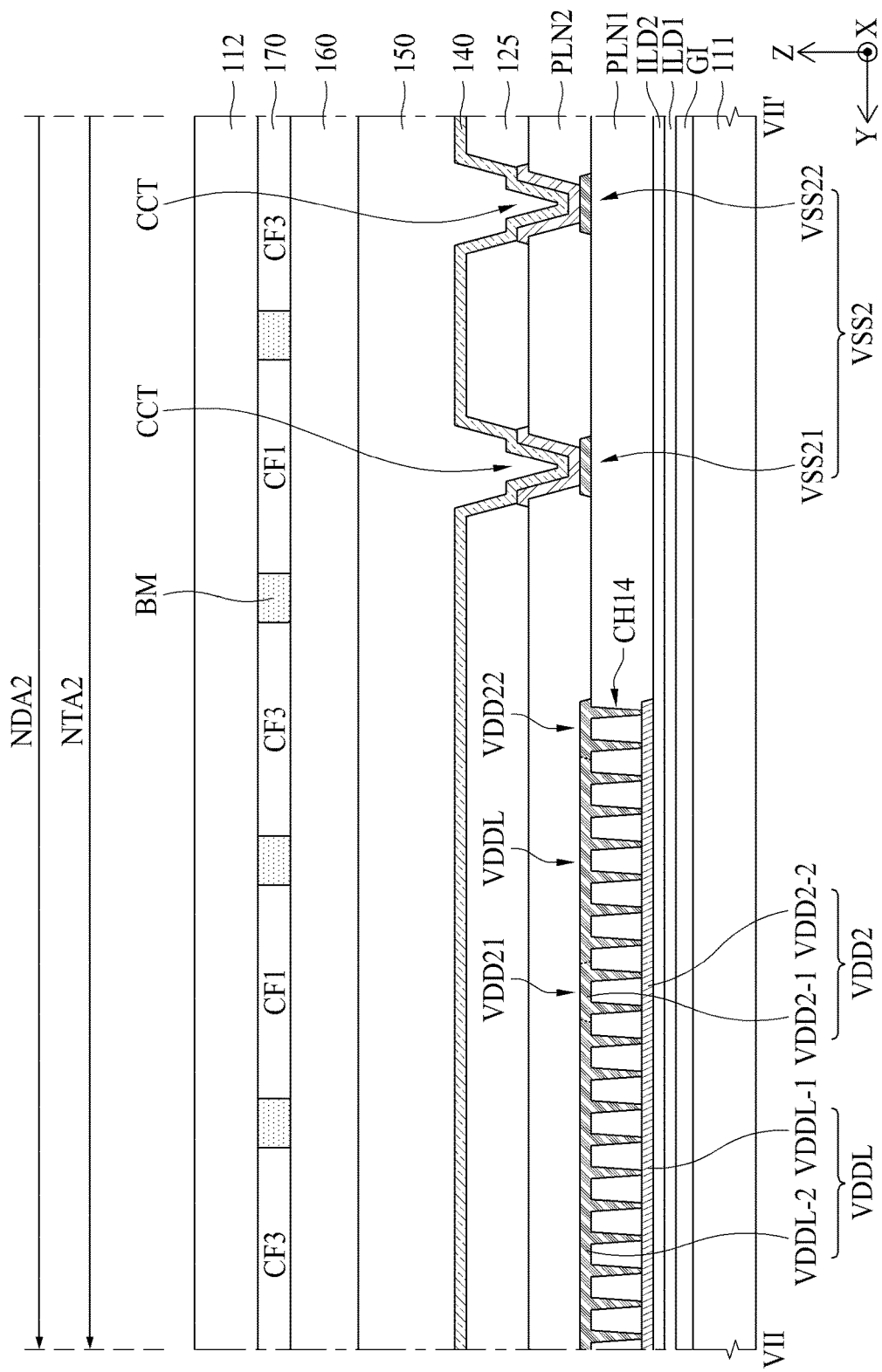
FIG. 15 is a cross-sectional view taken along line VII-VII' of FIG. 14.
Figure 16:
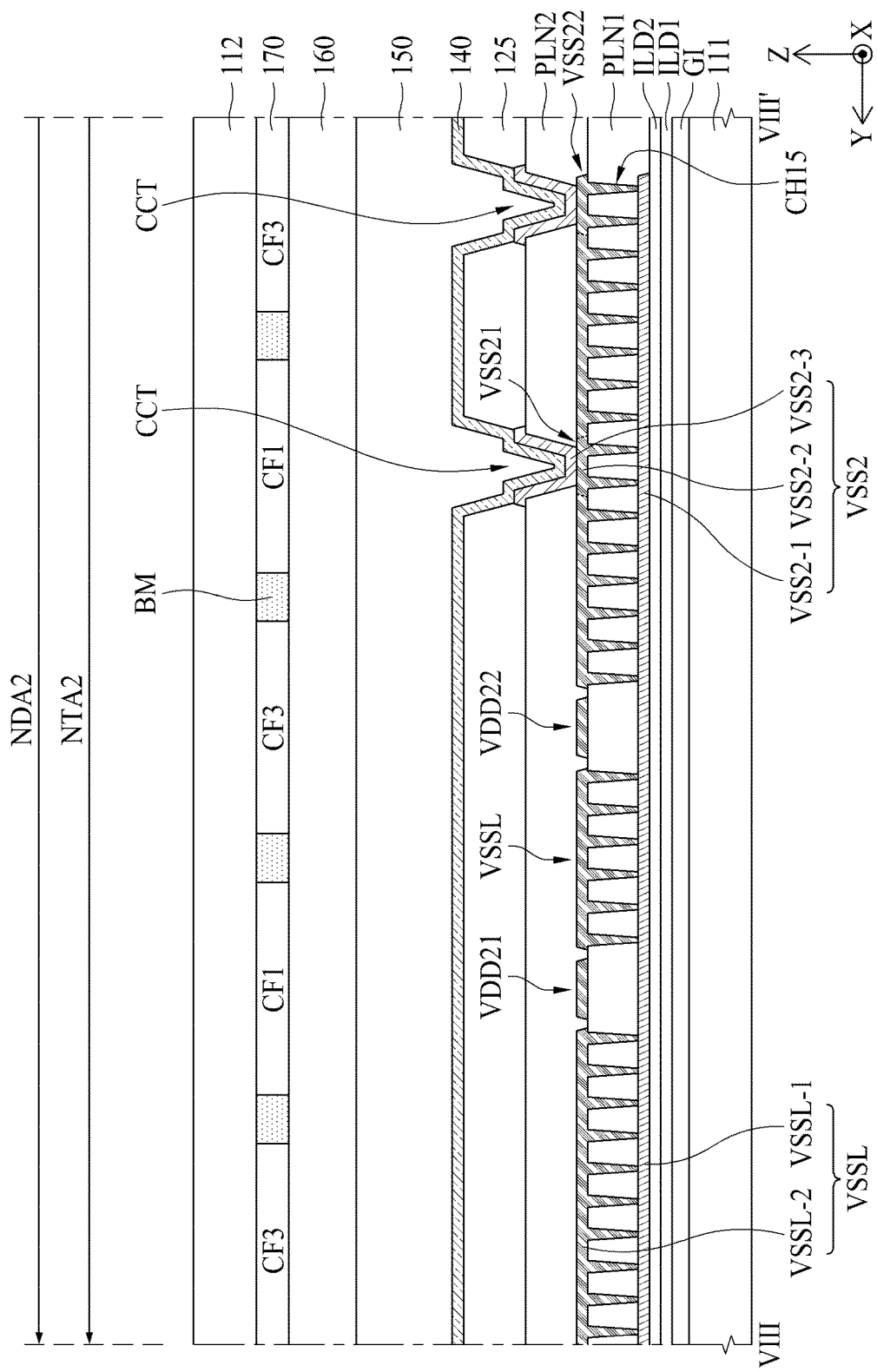
FIG. 16 is a cross-sectional view taken along line VIII-VIII' of FIG. 14.

FIG. 14 is an enlarged view of an area C in FIG. 2, FIG. 15 is a cross-sectional view taken along line VII-VII' of FIG. 14, FIG. 16 is a cross-sectional view taken along line VIII-VIII' of FIG. 14.

The display area DA, as shown in FIG. 3, may include first non-transmissive areas NTA1, and first transmissive areas TA1 provided between the first non-transmissive areas NTA1. The first transmissive area TA1 is an area through which most of externally incident light passes, and the first non-transmissive area NTA1 is an area through which most of externally incident light fails to transmit.

The first non-transmissive area NTA1 may be provided with third pixel power lines VDDL, third common power lines VSSL, reference lines, data lines, gate lines GL, and pixels P1, P2 and P3.

The gate lines GL may be extended in a first direction (X axis direction), and may cross the third pixel power lines VDDL, the third common power lines VSSL and the data lines in the display area DA.

The third pixel power lines VDDL, the third common power lines VSSL, and the data lines may be extended in a second direction (Y axis direction). Here, the third pixel power lines VDDL and the third common power lines VSSL may alternately be disposed in the display area DA. The first transmissive area TA1 may be disposed between the third pixel power line VDDL and the third common power line VSSL.

The second non-display area NDA2 may include second non-transmissive areas NTA2, and second transmissive areas TA2 provided between the second non-transmissive areas NTA2. The second transmissive area TA2 is an area through which most of externally incident light passes as it is, and the second non-transmissive area NTA2 is an area through which most of externally incident light fails to transmit.

The second non-transmissive area NTA2 may be provided with second pixel power lines VDD2, second common power lines VSS2, third pixel power lines VDDL and third common power lines VSSL.

The second pixel power line VDD2 may be extended from the second non-display area NDA2 in a first direction (X axis direction). The second pixel power line VDD2 may be provided in the second non-display area NDA2 in a plural number. The number of second pixel power lines VDD2 may be, but not limited to, as shown in FIG. 13. The number of second pixel power lines VDD2 may be three or more.

One second pixel power line VDD21 is disposed to be spaced apart from the other second pixel power line VDD22. Here, the second transmissive area TA2 may be provided between one second pixel power line VDD21 and the other second pixel power line VDD22.

The second transmissive area TA2 provided between one second pixel power line VDD21 and the other second pixel power line VDD22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

In the second non-transmissive area NTA2 provided with one second pixel power line VDD21 and the other second pixel power line VDD22, a width W2 in a second direction perpendicular to a first direction may be equal to a width W1 in a second direction of the first non-transmissive area NTA1 provided in the display area DA.

Each of one second pixel power line VDD21 and the other second pixel power line VDD22 may be disposed in the second non-transmissive area NTA2. Therefore, each of one second pixel power line VDD21 and the other second pixel power line VDD22 may have a width W3 equal to the width W2 of the second non-transmissive area NTA2 or a width W3 narrower than the width W2 of the second non-transmissive area NTA2.

In the transparent display panel 110 according to one embodiment of the present disclosure, the second pixel power line VDD2 provided in the second non-display area NDA2 does not have a wide width. In the transparent display panel 110 according to one embodiment of the present disclosure, the width W3 of the second pixel power line VDD2 may be formed to be equal to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second pixel power line VDD2 may be formed in a plural al number, whereby a total area of the second pixel power line VDD2 may be increased.

Moreover, in the transparent display panel 110 according to one embodiment of the present disclosure, the second pixel power line VDD2 may be formed of a plurality of metal layers to increase its total area.

In detail, the second pixel power line VDD2 may be provided with a plurality of metal layers. For example, the second pixel power line VDD2, as shown in FIG. 15, may include a first metal layer VDD2-1 and a second metal layer VDD2-2 provided over the first metal layer VDD2-1. The first metal layer VDD2-1 and the second metal layer VDD2-2 may partially be overlapped with each other, and may be connected with each other through a fourteenth contact hole CH14.

Here, the first metal layer VDD2-1 of the second pixel power line VDD2 may be made of an opaque metal material of low resistance. For example, the first metal layer VDD2-1 of the second pixel power line VDD2 may be provided on the same layer as the source electrode SE and the drain electrode DE of the driving transistor DT provided in the display area DA. The first metal layer VDD2-1 may be made of the same material as that of the source electrode SE and the drain electrode DE of the driving transistor DT and may be formed simultaneously with them.

The second metal layer VDD2-2 of the second pixel power line VDD2 may be made of an opaque metal material of low resistance. For example, the second metal layer VDD2-2 of the second pixel power line VDD2 may be provided on the same layer as the anode auxiliary electrode 115 provided in the display area DA. The second metal layer VDD2-2 may be made of the same material as that of the anode auxiliary electrode 115 and may be formed simultaneously with the anode auxiliary electrode 115. In this case, the second metal layer VDD2-2 of the second pixel power line VDD2 may be connected to the first metal layer VDD2-1 through a plurality of fourteenth contact holes CH14 that pass through the first planarization film PLN1.

In the transparent display panel 110 according to one embodiment of the present disclosure, as each of the plurality of second pixel power lines VDD2 provided in the second non-display area NDA2 is provided with a double layer, a total area of the second pixel power line VDD2 may be increased. Therefore, in the transparent display panel 110 according to one embodiment of the present disclosure, even though the width W3 of the second pixel power line VDD2 is formed to be narrow, whereby resistance of the second pixel power line VDD2 may be prevented from being increased.

Also, in the transparent display panel 110 according to one embodiment of the present disclosure, as the second metal layer VDD2-2 of the second pixel power line VDD2 may be connected to the first metal layer VDD2-1 of the second pixel power line VDD2 through the plurality of fourteenth contact holes CH14, the first metal layer VDD2-1 and the second metal layer VDD2-2 may stably be connected with each other.

Each of the third pixel power lines VDDL may be extended from the display area DA in a second direction (Y axis direction) and connected with the second pixel power line VDD2. The third pixel power line VDDL may be connected to one second pixel power line VDD21 and the other second pixel power line VDD22. In detail, each of the third pixel power lines VDDL may be extended from the display area DA in a second direction (Y axis direction), and thus may be connected with one end of one second pixel power line VDD21. Also, each of the third pixel power lines VDDL may be extended from the other end of one second pixel power line VDD21 in a second direction (Y axis direction), and thus may be connected with one end of the other second pixel power line VDD22. Therefore, one second pixel power line VDD21, the other second pixel power line VDD22 and the third pixel power lines VDDL may electrically be connected with one another.

The third pixel power lines VDDL may be formed on the same layer as the second pixel power line VDD2 in the second non-display area NDA2. In detail, the third pixel power line VDDL may include a first metal layer VDDL-1 and a second metal layer VDDL-2 in the second non-display area NDA2. The first metal layer VDDL-1 of the third pixel power line VDDL may be extended from the first metal layer VDD2-1 of the second pixel power line VDD2, and the second metal layer VDDL-2 of the third pixel power line VDDL may be extended from the second metal layer VDD2-2 of the second pixel power line VDD2.

The second common power line VSS2 may be extended from the second non-display area NDA2 in a first direction (X axis direction). The second common power line VSS2 may be provided in the second non-display area NDA2 in a plural number. The number of second common power lines VSS2 may be, but not limited to, as shown in FIG. 14. The number of second common power lines VSS2 may be three or more.

One second common power line VSS21 is disposed to be spaced apart from the other second common power line VSS22. Here, the second transmissive area TA2 may be provided between one second common power line VSS21 and the other second common power line VSS22.

The second transmissive area TA2 provided between one second common power line VSS21 and the other second common power line VSS22 may substantially have the same shape as that of the first transmissive area TA1 provided in the display area DA. In this case, the substantially same shape means that shapes on a plane have the same property. Sizes or rates of the shapes may be equal to or different from each other.

For example, the first transmissive area TA1 provided in the display area DA may have a rectangular shape, and may have a rounded corner but is not limited thereto. In this case, the second transmissive area TA2 may also have a rectangular shape, and may have a rounded corner.

Each of one second common power line VSS21 and the other second common power line VSS22 may be disposed in the second non-transmissive area NTA2. Therefore, as shown in FIG. 14, each of one second common power line VSS21 and the other second common power line VSS22 may have a width W5 equal to the width W4 of the second non-transmissive area NTA2 or a width W5 narrower than the width W4 of the second non-transmissive area NTA2.

In the transparent display panel 110 according to one embodiment of the present disclosure, the second common power line VSS2 provided in the second non-display area NDA2 does not have a wide width. In the transparent display panel 110 according to one embodiment of the present disclosure, the width W5 of the second common power line VSS2 may be formed to be equal to or narrower than the width W1 of the first non-transmissive area NTA1 provided in the display area DA, whereby the wide second transmissive area TA2 may be obtained in the second non-display area NDA2.

Meanwhile, in the transparent display panel 110 according to one embodiment of the present disclosure, the second common power line VSS2 may be formed in a plural number, whereby a total area of the second common power line VSS2 may be increased.

Moreover, in the transparent display panel 110 according to one embodiment of the present disclosure, the second common power line VSS2 may be formed of a plurality of metal layers to increase its total area.

In detail, the second common power line VSS2 may be provided with a plurality of metal layers. For example, the second common power line VSS2, as shown in FIG. 16, may include a first metal layer VSS2-1 and a second metal layer VSS2-2 provided over the first metal layer VSS2-1. The second common power lines VSS2 may further include a third metal layer VSS2-3 provided over the second metal layer VSS2-2. The first metal layer VSS2-1 and the second metal layer VSS2-2 may partially be overlapped with each other, and may be connected with each other through a fifteenth contact hole CH15. At least a part of the third metal layer VSS2-3 may be overlapped with the second metal layer VSS2-2, and may directly be adjacent onto the second metal layer VSS2-2.

Here, the first metal layer VSS2-1 of the second common power line VSS2 may be made of an opaque metal material of low resistance. For example, the second metal layer VSS2-1 of the second common power line VSS2 may be provided on the same layer as the source electrode SE and the drain electrode DE of the driving transistor DT provided in the display area DA. The first metal layer VSS2-1 may be made of the same material as that of the source electrode SE and the drain electrode DE of the driving transistor DT and may be formed simultaneously with them.

The second metal layer VSS2-2 of the second common power line VSS2 may be made of an opaque metal material of low resistance. For example, the second metal layer VSS2-2 of the second common power line VSS2 may be provided on the same layer as the anode auxiliary electrode 115 provided in the display area DA. The second metal layer VSS2-2 may be made of the same material as that of the anode auxiliary electrode 115 and may be formed simultaneously with the anode auxiliary electrode 115. In this case, the second metal layer VSS2-2 of the second common power line VSS2 may be connected to the first metal layer VSS2-1 through a plurality of fifteenth contact holes CH15 that pass through the first planarization film PLN1.

The third metal layer VSS2-3 of the second common power line VSS2 may be made of an opaque metal material of low resistance. For example, the third metal layer VSS2-3 of the second common power line VSS2 may be provided on the same layer as the anode electrode 120 provided in the display area DA. The third metal layer VSS2-3 may be made of the same material as that of the anode electrode 120 and may be formed simultaneously with the anode electrode 120.

In the transparent display panel 110 according to one embodiment of the present disclosure, as each of the plurality of second common power lines VSS2 provided in the second non-display area NDA2 is provided with a plurality of layers, a total area of the second common power line VSS2 may be increased. Therefore, in the transparent display panel 110 according to one embodiment of the present disclosure, even though the width W5 of the second common power line VSS2 is formed to be narrow, whereby resistance of the second common power line VSS2 may be prevented from being increased.

Also, in the transparent display panel 110 according to one embodiment of the present disclosure, as the second metal layer VSS2-2 of the second common power line VSS2 may be connected to the first metal layer VSS2-1 of the second common power line VSS2 through the plurality of fifteenth contact holes CH15, the first metal layer VSS2-1 and the second metal layer VSS2-2 may stably be connected with each other.

Meanwhile, each of the second common power lines VSS2 may electrically be connected with the cathode electrode 140 through a cathode contact portion CCT. The cathode contact portion CCT may partially remove the bank 125 and partially expose the upper surface of the third metal layer VSS2-3 of the second common power lines VSS2. The cathode contact portion CCT may longitudinally expose the upper surface of the third metal layer VSS2-3 of the second common power lines VSS2 along the first direction (X axis direction). As a result, the second common power lines VSS2 may have a wide contact area with the cathode electrode 140, thereby being stably connected to the cathode electrode 140.

Each of the third common power lines VSSL may be extended from the display area DA in a second direction (Y axis direction) and connected with the second common power line VSS2. The third common power line VSSL may be connected to one second common power line VSS21 and the other second common power line VSS22. In detail, each of the third common power lines VSSL may be extended from the display area DA in a second direction (Y axis direction), and thus may be connected with one end of one second common power line VSS21. Also, each of the third common power lines VSSL may be extended from the other end of one second common power line VSS21 in a second direction (Y axis direction), and thus may be connected with one end of the other second common power line VSS22. Therefore, one second common power line VSS21, the other second common power line VSS22 and the third common power lines VSSL may electrically be connected with one another.

The third common power lines VSSL may be formed on the same layer as the second common power line VSS2 in the second non-display area NDA2. In detail, the third common power line VSSL may include a first metal layer VSSL-1 and a second metal layer VSSL-2 in the second non-display area NDA2. The first metal layer VSSL-1 of the third common power line VSSL may be extended from the first metal layer VSS2-1 of the second common power line VSS2, and the second metal layer VSSL-2 of the third common power line VSSL may be extended from the second metal layer VSS2-2 of the second common power line VSS2.

The second pixel power lines VDD2 may be provided between the second common power lines VSS2 and the display area DA as shown in FIG. 14. In this case, the third common power lines VSSL may include one of the first metal layer VSSL-1 and the second metal layer VSSL-2 in the area overlapped with the second pixel power lines VDD2.

For example, in some embodiments, the third common power lines VSSL may include only the first metal layer VSSL-1 of the first metal layer VSSL-1 and the second metal layer VSSL-2 in the area overlapped with the second pixel power lines VDD2 as shown in FIG. 16. Here, the second pixel power lines VDD2 may include only the second metal layer VDD2-2 of the first metal layer VDD2-1 and the second metal layer VDD2-2 in the area overlapped with the third common power lines VSSL, and may not be electrically connected with the third common power lines VSSL.

In the transparent display panel 110 according to one embodiment of the present disclosure, the second common power line VSS2 may be formed in a plural number, and the plurality of second common power lines VSS2 may be spaced apart from one another to form the second transmissive area TA2. Also, in the transparent display panel 110 according to one embodiment of the present disclosure, the second pixel power line VDD2 may be formed in a plural number, and the plurality of second pixel power lines VDD2 may be spaced apart from one another to form the second transmissive area TA2. Therefore, in the transparent display panel 110 according to one embodiment of the present disclosure, since the second transmissive area TA2 is also provided in the non-display area NDA2 like the display area DA, transmittance in the second non-display area NDA2 may be improved.

The transparent display panel 110 according to one embodiment of the present disclosure may have similar transmittance in the second non-display area NDA2 and the display area DA. Accordingly, in some embodiments, in the transparent display panel 110 according to one embodiment of the present disclosure, an area of the first transmissive area TA1 provided in a unit area and an area of the second transmissive area TA2 provided in a unit area may be designed to be equal to each other.

In detail, in one embodiment, the second transmissive area TA2 provided in the second non-display area NDA2 may have the same shape as that of the first transmissive area TA1 provided in the display area DA.

Also, in the transparent display panel 110 according to one embodiment of the present disclosure, a width W7 in the first direction (X axis direction) of the second transmissive area TA2 provided in the second non-display area NDA2 may be equal to a width W6 in the first direction (X axis direction) of the first transmissive area TA1. This is because that a spaced distance between the third pixel power line VSSL and the third common power line VDDL in the second non-display area NDA2 is equal to a spaced distance between the third pixel power line VSSL and the third common power line VDDL. The width in the first direction (X axis direction) of the transmissive areas TA1 and TA2 may be determined by the spaced distance between the third pixel power line VSSL and the third common power line VDDL.

Also, in the transparent display panel 110 according to one embodiment of the present disclosure, a width W2 in the second direction (Y axis direction) of the second non-transmissive area NTA2 provided in the second non-display area NDA2 may be equal to the width W1 in the second direction (Y axis direction) of the first non-transmissive area NTA1.

Therefore, in the transparent display panel 110 according to one embodiment of the present disclosure, transmittance similar to that in the display area DA may be embodied in the second non-display area NDA2.

Moreover, the transparent display panel 110 according to one embodiment of the present disclosure may further include a color filter layer 170 and a black matrix BM in the second non-transmissive area NTA2 of the second non-display area NDA2.

In more detail, color filters CF1, CF2 and CF3 formed over the second pixel power line VDD2, the second common power line VSS2, the third pixel power lines VDDL and the third common power lines VSSL, and the black matrix BM formed among the color filters CF1, CF2 and CF3 may be provided in the second non-transmissive area NTA2 of the second non-display area NDA2. Here, the color filters CF1, CF2 and CF3 may be formed to be patterned in the second non-display area NDA2 in the same shape as that of the color filters CF1, CF2 and CF3 provided in the display area DA.

The color filter layer 170 and the black matrix BM may not be provided in the second transmissive area TA2 of the second non-display area NDA2 to enhance transmittance. Therefore, in the transparent display panel 110 according to one embodiment of the present disclosure, a difference between transmittance in the second non-display area NDA2 and transmittance in the display area DA may be reduced or minimized.

Meanwhile, in the transparent display panel 110 according to one embodiment of the present disclosure, the pixel power line VDD, the common power line VSS and the reference line VREF may be provided in only the first non-display area NDA1 and the second non-display area NDA2 of the non-display area NDA. In the transparent display panel 110 according to one embodiment of the present disclosure, each of the pixel power line VDD, the common power line VSS and the reference line VREF may be formed in a double layer structure, and each of the common power line VSS and the reference line VREF provided in the first non-display area NDA1 may be connected with a plurality of connection electrodes. Therefore, even though the pixel power line VDD, the common power line VSS and the reference line VREF are provided in only the first non-display area NDA1 and the second non-display area NDA2, the transparent display panel 110 according to one embodiment of the present disclosure may make sure of a sufficient area of each of the pixel power line VDD, the common power line VSS and the reference line VREF and reduce or minimize resistance.

In the transparent display panel 110 according to one embodiment of the present disclosure, as the pixel power line VDD, the common power line VSS and the reference line VREF are not provided in the third non-display area NDA3 and the fourth non-display area NDA4, transmittance in the third non-display area NDA3 and the fourth non-display area NDA4 may be improved. That is, the transparent display panel 110 according to one embodiment of the present disclosure may have transmittance even in the third non-display area NDA3 and the fourth non-display area NDA4, which is similar to that of the display area DA.

It will be apparent to those skilled in the art that the present disclosure described above is not limited by the above-described embodiments and the accompanying drawings and that various substitutions, modifications, and variations can be made in the present disclosure without departing from the spirit or scope of the disclosures. Consequently, the scope of the present disclosure is intended to cover all variations or modifications derived from the meaning, scope, and equivalent concept of the present disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A transparent display device, comprising:
   a substrate provided with a display area including a transmissive area and a non-transmissive area, in which a plurality of subpixels are disposed, and a non-display area adjacent to the display area;
   a driving transistor provided in the non-transmissive area on the substrate, including an active layer, a gate electrode, a source electrode, and a drain electrode;
   a capacitor provided in the non-transmissive area on the substrate, including a first capacitor electrode and a second capacitor electrode; and
   a signal line including a same material as that of the active layer of the driving transistor and located on a same layer as the active layer,
   wherein the second capacitor electrode is not overlapped with the active layer of the driving transistor, and
   wherein the capacitor does not overlap with the signal line.

2. The transparent display device of claim 1, further comprising:
   a gate insulating film provided between the active layer and the gate electrode; and
   a first inter-layer insulating layer provided between the first capacitor electrode and the second capacitor electrode,
   wherein the first inter-layer insulating layer is thinner than the gate insulating film.

3. The transparent display device of claim 1, further comprising a second inter-layer insulating layer provided over the second capacitor electrode, wherein the source electrode and the drain electrode are provided over the second inter-layer insulating layer.

4. The transparent display device of claim 1, further comprising:
   a first inter-layer insulating layer on the gate electrode and the first capacitor electrode; and
   a second inter-layer insulating layer on the second capacitor electrode,
   wherein each of the first inter-layer insulating layer and the second inter-layer insulating layer includes an inorganic film having a refractive index of 1.8 to 1.9.

5. The transparent display device of claim 4, further comprising:
   bank provided in the non-transmissive area,
   wherein a distance between the transmissive area and an end of the first inter-layer insulating layer and the second inter-layer insulating layer is shorter than a distance between the transmissive area and an end of the banks.

6. The transparent display device of claim 1, further comprising:
   a plurality of common power lines on the substrate and extended from the display area in a first direction; and
   a plurality of pixel power lines on the substrate and extended from the display area in the first direction,
   wherein the plurality of common power lines and the plurality of pixel power lines are alternately disposed, and wherein the transmissive area is provided between the common power line and the pixel power line.

7. The transparent display device of claim 6, further comprising:
a gate line extended in a second direction where the common power line and the pixel power line cross each other;
a first overlapping area where the common power line and the gate line cross each other; and
a second overlapping area where the pixel power line and the gate line cross each other,
wherein the driving transistor and the capacitor are disposed between the first overlapping area and the second overlapping area.

8. The transparent display device of claim 7, wherein an anode electrode of a subpixel of the plurality of subpixels corresponding to the first and second overlapping areas includes a first portion, a second portion, and a third portion,
wherein the second portion and the third portion each protrudes from opposite sides of the first portion, and
wherein the driving transistor and the capacitor are provided below the first portion, the common power line and the pixel power line are provided below the second portion or the third portion.

9. The transparent display device of claim 7, wherein an anode electrode of a subpixel of the plurality of subpixels not corresponding to the first and second overlapping areas has an area smaller than those of an anode electrode of a subpixel of the plurality of subpixels corresponding to the first and second overlapping areas.

10. The transparent display device of claim 7, wherein the capacitor and the driving transistor are provided between the first overlapping area and the second overlapping area.

11. A transparent display device comprising:
a substrate provided with a display area including a transmissive area and a non-transmissive area, in which a plurality of subpixels are disposed, and a non-display area adjacent to the display area;
a driving transistor provided in the non-transmissive area on the substrate, including an active layer, a gate electrode, a source electrode, and a drain electrode;
a capacitor provided in the non-transmissive area on the substrate, including a first capacitor electrode and a second capacitor electrode; and
wherein the second capacitor electrode does not overlap with the active layer of the driving transistor, and
wherein the first capacitor electrode is extended from the gate electrode of the driving transistor, and the second capacitor electrode is provided between the gate electrode and the drain electrode.

12. A transparent display device, comprising:
a substrate provided with a display area including a transmissive area and a non-transmissive area, in which a plurality of subpixels are disposed, and a non-display area adjacent to the display area;
a driving transistor provided in the non-transmissive area on the substrate, including an active layer, a gate electrode, a source electrode, and a drain electrode;
a capacitor provided in the non-transmissive area on the substrate, including a first capacitor electrode and a second capacitor electrode;

a first planarization film on the driving transistor and the capacitor;
a first contact hole that extends through the first planarization film;
an anode auxiliary electrode on the first planarization film and electrically connected with the driving transistor through the first contact hole;
a second planarization film on the anode auxiliary electrode;
a second contact hole that extends through the second planarization film; and
an anode electrode on the second planarization film that is electrically connected with the anode auxiliary electrode through the second contact hole,
wherein the second capacitor electrode does not overlap with the active layer of the driving transistor.

13. The transparent display device of claim 12, wherein the first contact hole and the second contact hole are disposed to be spaced apart from each other.

14. The transparent display device of claim 12, wherein the first contact hole is disposed to be spaced apart from an area where the capacitor is provided, and wherein the second contact hole is disposed in an area where the second contact hole overlaps the capacitor.

15. The transparent display device of claim 12, wherein the second contact hole is on the second capacitor electrode of the capacitor.

16. A transparent display device, comprising:
a substrate provided with a display area including a transmissive area and a non-transmissive area, in which a plurality of subpixels are disposed, and a non-display area adjacent to the display area;
a light emitting diode provided in the non-transmissive area on the substrate, including an anode electrode, a light emitting layer, and a cathode electrode;
a driving transistor provided between the light emitting diode and the substrate and disposed in a first area of the non-transmissive area;
a capacitor provided between the light emitting diode and the substrate and disposed in a second area of the non-transmissive area; and
an anode auxiliary electrode provided between the driving transistor and the light emitting diode, electrically connecting the driving transistor with the anode electrode of the light emitting diode,
wherein the second area where the capacitor is disposed is not overlapped with the first area where the driving transistor is provided, and
wherein the anode auxiliary electrode is connected to the driving transistor through a first contact hole, and the first contact hole is spaced apart from the second area where the capacitor is disposed.

17. The transparent display device of claim 16, wherein the anode electrode of the light emitting diode is connected to the anode auxiliary electrode through a second contact hole, and the second contact hole is disposed in the second area where the capacitor is disposed.

* * * * *